(12) United States Patent
Ishiguro

(10) Patent No.: US 7,943,935 B2
(45) Date of Patent: May 17, 2011

(54) SEMICONDUCTOR DEVICE, METHOD FOR MANUFACTURING SEMICONDUCTOR DEVICE, AND ELECTRO-OPTICAL APPARATUS

(75) Inventor: Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 667 days.

(21) Appl. No.: 11/877,350

(22) Filed: Oct. 23, 2007

(65) Prior Publication Data
US 2008/0121889 A1  May 29, 2008

(30) Foreign Application Priority Data

Nov. 29, 2006 (JP) ................................. 2006-321273

(51) Int. Cl.
*H01L 29/04* (2006.01)
*H01L 21/04* (2006.01)
*H01L 29/786* (2006.01)

(52) U.S. Cl. ........................................................ 257/66

(58) Field of Classification Search ............... 257/57, 257/59, 72, 83, 223, 227, 291, 292, 439, 257/443, 655, 66, 336, 347, 350, 408–412, 257/E27.1, E27.125, E27.117, E21.411–E21.416, 257/E29.145, E29.147, E29.151, E29.182, 257/E29.202, E29.273–E29.299, E29.314, 257/E29.32, E23.016, E21.094, E21.104, 257/E21.121, E21.372; 438/149, 163

See application file for complete search history.

(56) References Cited

U.S. PATENT DOCUMENTS

| | | | | |
|---|---|---|---|---|
| 5,412,493 A | * | 5/1995 | Kunii et al. | ........................ 349/43 |
| 6,025,607 A | * | 2/2000 | Ohori et al. | ........................ 257/72 |
| 6,184,559 B1 | | 2/2001 | Hayakawa et al. | |
| 6,287,898 B1 | | 9/2001 | Sera | |
| 6,426,517 B2 | | 7/2002 | Hayakawa et al. | |
| 6,469,317 B1 | * | 10/2002 | Yamazaki et al. | ............... 257/59 |
| 6,548,356 B2 | | 4/2003 | Lui et al. | |
| 6,566,714 B2 | * | 5/2003 | Deane et al. | ................. 257/350 |
| 6,576,926 B1 | * | 6/2003 | Yamazaki et al. | ............... 257/66 |
| 6,580,129 B2 | | 6/2003 | Lui et al. | |
| 6,777,716 B1 | * | 8/2004 | Yamazaki et al. | ............... 257/88 |
| 6,890,784 B2 | * | 5/2005 | Yamazaki et al. | ............... 438/30 |
| 6,891,195 B2 | * | 5/2005 | Yamazaki et al. | ............... 257/59 |

(Continued)

FOREIGN PATENT DOCUMENTS

JP   A-10-154816   6/1998

(Continued)

OTHER PUBLICATIONS

Nam, W. et al. "Kink-current Reduced Poly-Si TFTs Employing Asymmetric Dual-Gate Design for AMOLED Pixel Elements." *Proceedings of the International Display Workshop.* 2004. School of Electrical Engineering #50, Seoul National University, 151-742, Seoul, Korea. pp. 307-310.

(Continued)

*Primary Examiner* — Dao H Nguyen
*Assistant Examiner* — Tram H Nguyen
(74) *Attorney, Agent, or Firm* — Oliff & Berridge, PLC

(57) ABSTRACT

A semiconductor device includes a thin-film transistor including a polycrystalline silicon layer, disposed above a substrates serving as an active layer. The thin-film transistor includes a first thin-film transistor section including a first channel region disposed in a drain-side portion of the polycrystalline silicon layer and also includes a second thin-film transistor section including a second channel region that is adjacent to the first channel region with an impurity-implanted region disposed therebetween. The first and second thin-film transistor sections are of the same conductivity type. The gate electrode of the first thin-film transistor section is electrically connected to the gate electrode of the second thin-film transistor section. The first thin-film transistor section has a channel length of less than 2 μm.

8 Claims, 11 Drawing Sheets

U.S. PATENT DOCUMENTS

| | | | |
|---|---|---|---|
| 7,138,657 B2 * | 11/2006 | Kasahara | 257/66 |
| 7,208,766 B2 * | 4/2007 | Yamazaki et al. | 257/72 |
| 7,439,543 B2 * | 10/2008 | Yamazaki | 257/66 |
| 7,626,205 B2 * | 12/2009 | Ishiguro | 257/72 |
| 2002/0158248 A1 * | 10/2002 | Lui et al. | 257/59 |
| 2004/0051142 A1 * | 3/2004 | Yamazaki et al. | 257/347 |
| 2005/0253149 A1 * | 11/2005 | Yamazaki et al. | 257/72 |
| 2007/0241336 A1 * | 10/2007 | Tokioka et al. | 257/72 |
| 2009/0261337 A1 * | 10/2009 | Sakakura et al. | 257/72 |

FOREIGN PATENT DOCUMENTS

| | | |
|---|---|---|
| JP | A-11-073165 | 3/1999 |
| JP | A-11-354808 | 12/1999 |
| JP | A-2003-519915 | 6/2003 |
| JP | A-2003-519917 | 6/2003 |
| JP | A-2004-525526 | 8/2004 |
| JP | A-2004-361424 | 12/2004 |
| JP | A-2005-094221 | 4/2005 |
| JP | A-2005-340638 | 12/2005 |
| WO | WO 02/091475 A1 | 11/2002 |

OTHER PUBLICATIONS

Mariucci L. et al. "Kink effect in short-channel polycrystalline silicon thin-film transistors." Proceedings International Workshop on AM-LCD. Jul. 9-11, 2003, pp. 57-60.

* cited by examiner

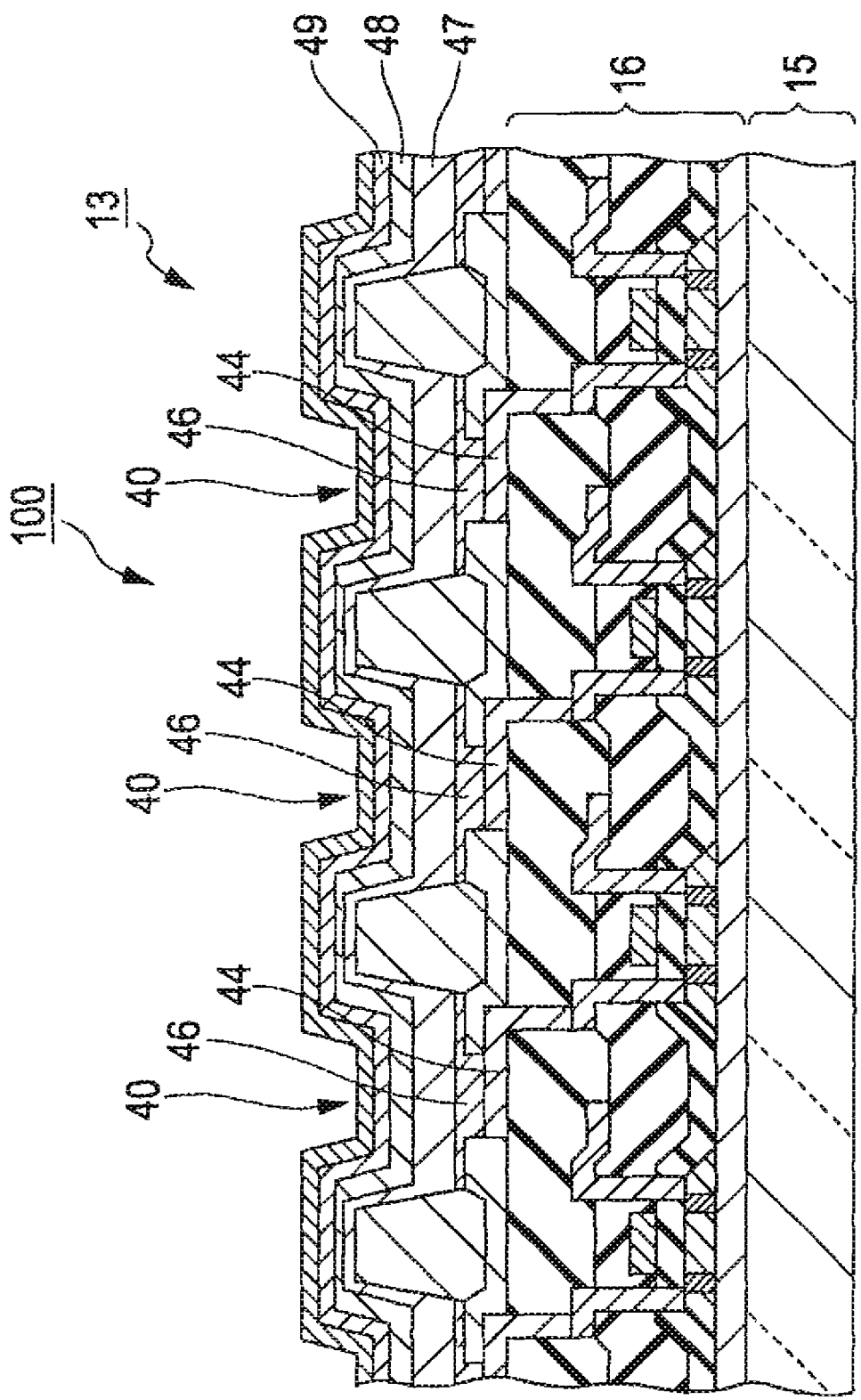

FIG. 12A
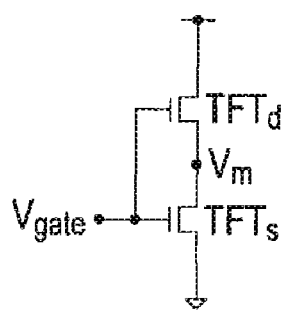
FIG. 12B
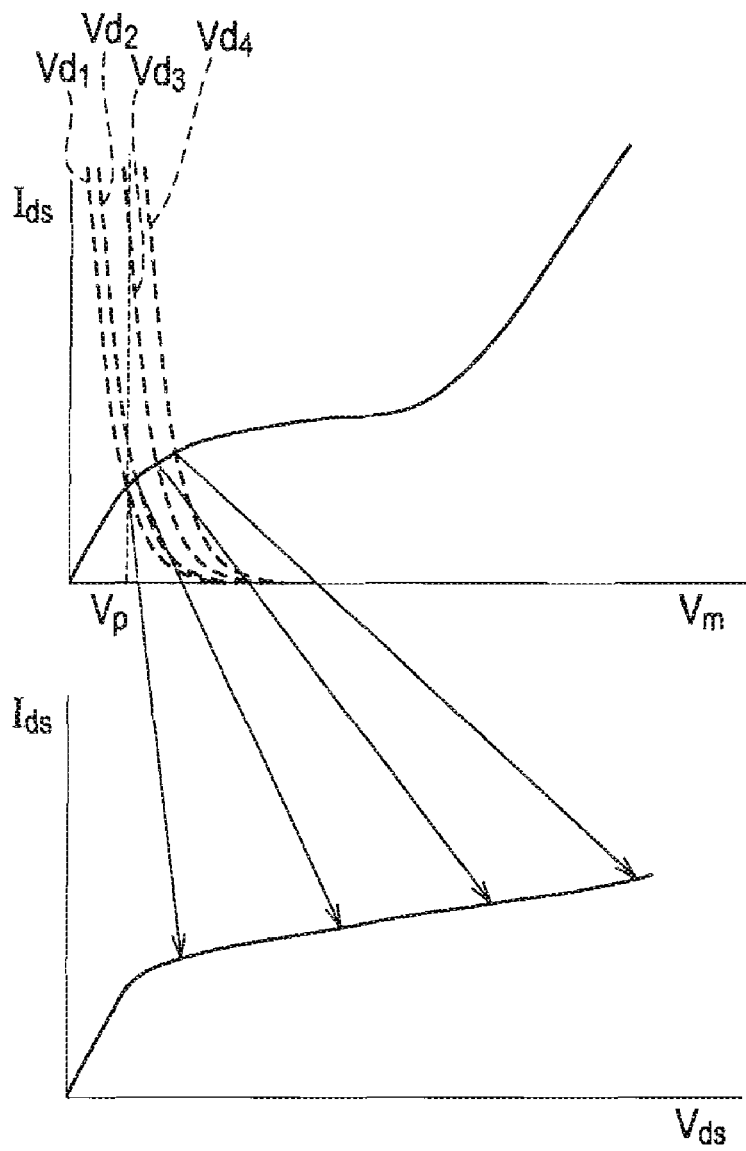
FIG. 12C

SEMICONDUCTOR DEVICE, METHOD FOR MANUFACTURING SEMICONDUCTOR DEVICE, AND ELECTRO-OPTICAL APPARATUS

BACKGROUND

1. Technical Field

The present invention relates to a semiconductor device including a thin-film transistor including a polycrystalline silicon layer, disposed above a substrate, serving as an active layer; a method for manufacturing the semiconductor device; and an electro-optical apparatus.

2. Related Art

Thin-film transistors are used to control currents applied to organic electroluminescent elements disposed in electro-optical apparatuses or are used in liquid crystal apparatuses containing analogue circuits, disposed on substrates, including as operational amplifiers. The thin-film transistors are used for these applications because of their saturation characteristics. The saturation characteristics of the thin-film transistors are less complete than those of MOS transistors formed on silicon substrates. Therefore, the following phenomenon occurs in the thin-film transistors: a phenomenon that drain currents increase due to variations in drain voltages. Phenomena similar to such a phenomenon are described below with reference to FIG. 10.

First Phenomenon

As shown in FIG. 10, in a thin-film transistor, the drain current increases in the high drain voltage region because of a phenomenon called a kink effect. This increases the ratio of a change in the drain current to a change in the drain voltage. Such a phenomenon is probably caused as described below. In the thin-film transistor, if the drain voltage increases to exceed the pinch-off voltage, a relatively large electric field is concentrated on an end of the drain. When the electric field exceeds a certain intensity, electrons accelerated by the electric field cause impact ionization, thereby generating electron-hole pairs. Holes generated in a bulk MOS transistor by impact ionization flow toward a semiconductor substrate and therefore have no significant influence on the source-drain current. Holes generated in the thin-film transistor by impact ionization flow into the channel zone to reduce the potential of the channel zone because the channel zone has no contact with these holes, thereby increasing the electron current. In order to prevent the electric field from being concentrated on the drain end, the following structure may be used: a lightly doped drain (LDD) structure in which a semiconductor layer has a lightly doped region opposed to an end portion of a gate electrode. However, the LDD structure is insufficient to completely suppress the kink effect.

Second Phenomenon

For an enhancement transistor, particularly a bulk MOS transistor, a operating point in which the drain voltage that is $V_{th}$ less than the voltage $V_{ds}=V_{gs}$ corresponds to the pinch-off voltage $V_p$ and the range of the source-drain voltage $V_{ds}$ corresponds to a saturation region. However, the pinch-off voltage of the thin-film transistor is unclear as shown in FIG. 10. That is, the linear region and saturation region of the thin-film transistor are separated from each other with a relatively wide voltage range. This is probably because the potential of the channel zone of the thin-film transistor depends on relations among the gate voltage, the drain voltage, and the source voltage. That is, the drain voltage probably influences the gate electrode through not only the semiconductor layer, through which a current flows, but also an insulator located on the side opposite to the gate electrode. If the LDD structure is used to cope with the first phenomenon, an LDD region usually acts as a parasitic resistor; hence, the effective drain voltage applied to the channel zone is small.

Third Phenomenon

In the thin-film transistor, a region between the region in which the source-drain current increases as described in the first phenomenon and the pinch-off voltage described in the second phenomenon is referred to as a saturation region. As shown in FIG. 10, in the saturation region, the ratio of a change in the drain current to a change in the drain voltage is not sufficiently small. Therefore, there is a problem in that constant-current operation cannot be assured.

Design techniques for solving such a problem may use structures below.

Structure A

A thin-film transistor with a large channel length is effective in improving the third phenomenon. The increase in the channel length thereof reduces the intensity of an electric field acting in the drain direction and therefore improves the second phenomenon. However, in order to achieve sufficient characteristics, the channel length needs to be very large. The increase in the channel length increases the gate capacitance and therefore impairs high-frequency characteristics of a circuit. The increase in the channel length reduces the sensitivity to varying the gate current by varying the gate voltage. Furthermore, the increase in the channel length increases the area occupied by the thin-film transistor and therefore is limited.

Structure B

It is known that an LDD region that is formed at an end of the drain of a thin-film transistor such that the intensity of an electric field acting on the drain end is reduced. The first phenomenon can be improved in such a manner that the impurity concentration of the LDD region is set to be sufficiently small and the length thereof is set to be sufficiently large. However, the LDD region usually acts as a parasitic resistor and therefore limits the on-current of the thin-film transistor. The presence of the LDD region reduces the effective drain voltage and therefore causes the second phenomenon to be serious.

Structure C

FIG. 11A shows Structure C including a drain-side thin-film transistor $TFT_d$ and a source-side thin-film transistor $TFT_s$ connected to each other in series. A constant voltage $V_{bias}$ is applied to the gate of the drain-side thin-film transistor $TFT_d$. FIG. 11B shows current-voltage characteristics of the drain-side and source-side thin-film transistors $TFT_d$ and $TFT_s$ using the node voltage $V_m$ as a parameter. With reference to FIG. 11B, broken lines show current-voltage characteristic curves of the drain-side thin-film transistors $TFT_d$ that have been obtained by varying the drain voltage $V_d$ in this order: $V_{d1}$, $V_{d2}$, $V_{d3}$, and $V_{d4}$. Nodes of the current-voltage characteristic curve of the source-side thin-film transistor $TFT_s$ and the current-voltage characteristic curves of the drain-side thin-film transistors $TFT_d$ correspond to the operating currents of the drain-side and source-side thin-film transistors $TFT_d$ and $TFT_s$ connected in series. As shown in FIG. 11C, the saturation operation of Structure C is greatly improved. This connection is referred to as a cascode connection and is common among MOS analogue circuits. Structure C has a problem in that a circuit for generating the voltage $V_{bias}$ applied to the gate of the drain-side thin-film transistor $TFT_d$ is necessary and a problem in the input range of the voltage $V_{gate}$ applied to the gate of the source-side thin-film transistor $TFT_s$ is limited.

Structure D

FIG. 12A shows Structure D including a first thin-film transistor $TFT_d$ and second thin-film transistor $TFT_s$ connected to each other in series. The gates of the first and second thin-film transistors $TFT_d$ and $TFT_s$ are electrically connected to each other; hence, a voltage $V_{gate}$ is commonly applied to the gates of the first and second thin-film transistors $TFT_d$ and $TFT_s$ instead of voltages $V_{bias}$ and $V_{gate}$. This allows Structure D to operate as well as Structure C. FIG. 12B shows current-voltage characteristics of the first and second thin-film transistors $TFT_d$ and $TFT_s$ using the node voltage $V_m$ as a parameter. With reference to FIG. 11B, broken lines show current-voltage characteristic curves of the first thin-film transistors $TFT_d$ that have been obtained by varying the drain voltage $V_d$. Nodes of the current-voltage characteristic curve of the second thin-film transistor $TFT_s$ and the current-voltage characteristic curves of the first thin-film transistors $TFT_d$ correspond to the operating currents of the first and second thin-film transistors $TFT_d$ and $TFT_s$ connected in series. As shove in FIG. 11C, the saturation operation of Structure D is greatly improved. Structure D is disclosed in the following documents: L. Mariucci et al, AM-LCD 2003, pp 57-60 (hereinafter referred to as Non-patent Document 1) and Woo-Jin Nam et al, IDW 2004, pp 307-310 (hereinafter referred to as Non-patent Document 2).

Japanese Unexamined Patent Application Publication No. 2004-361424 (hereinafter referred to as Patent Document 1) discloses a structure including a drain-side thin-film transistor $TFT_d$ and a source-side thin-film transistor $TFT_s$, connected to each other in series. The gates of the drain-side and source-side thin-film transistors $TFT_d$ and $TFT_s$ are electrically connected to each other. The quotient $W_d/L_d$ obtained by dividing the channel width by the channel length of the drain-side thin-film transistor $TFT_d$ is greater than the quotient $W_s/L_s$ obtained by dividing the channel width by the channel length of the source-side thin-film transistor $TFT_s$. Furthermore, when the drain-side and source-side thin-film transistor $TFT_d$ and $TFT_s$ are both a n-type, the threshold voltage of the source-side thin-film transistor $TFT_s$ is set to be less than that of the drain-side thin-film transistor $TFT_d$. These are effective in minimizing variations in the drain-side and source-side thin-film transistor $TFT_d$ and $TFT_s$.

It is apparent that the operating point of the first thin-film transistor $TFT_d$ of structure D shown in FIG. 12A is limited to the vicinity of the pinch-off voltage $V_p$ of the second thin-film transistor $TFT_s$. When the operating point of the first thin-film transistor $TFT_d$ is in the linear operation region of the second thin-film transistor $TFT_s$, no advantage can be achieved. In order to achieve a good operating point, the ratio of the quotient $W_d/L_d$ to the quotient $W_s/L_s$ is limited. When the ratio $(W_d/L_d)/(W_s/L_s)$ is greater than four, the first phenomenon can be solved.

In the thin-film transistors, the ratio of a change in the source-drain current $I_d$ to a change in the source-drain voltage $V_{ds}$ is large in the vicinity of the pinch-off voltage $V_p$. Therefore, in order to solve the second phenomenon, the ratio $(W_d/L_d)/(W_s/L_s)$ needs to be greatly increased. If layout is made in an ordinary design range, high-frequency properties of circuits are impaired because of an increase in gate capacitance and the area occupied by the thin-film transistors is increased.

In the structure disclosed in Patent Document 1 when the drain-side and source-side thin-film transistor $TFT_d$ and $TFT_s$ are of a n-type, the threshold voltage of the source-side thin-film transistor $TFT_d$ and $TFT_s$ is set to be less than that of the drain-side thin-film transistor $TFT_d$, because the drain-side and source-side thin-film transistor $TFT_d$ and $TFT_s$ have different purposes. Therefore, there is a problem in that a operating point is present in a region where the ratio of $I_{ds}$ to $V_{ds}$ is large in the vicinity of the pinch-off voltage $V_p$ of each thin-film transistor.

SUMMARY

An advantage of an aspect of the invention is to provide a semiconductor device from which a stable output can be obtained even if a source-drain current fluctuates in the saturation operation region of a thin-film transistor because of a kink effect. An advantage of another aspect of the invention is to provide a method for manufacturing the semiconductor device. An advantage of another aspect of the invention is to provide an electro-optical apparatus.

A semiconductor device according to the present invention includes a thin-film transistor including a polycrystalline silicon layer, disposed above a substrate, serving as an active layer. The thin-film transistor includes a first thin-film transistor section including a first channel region disposed in a drain-side portion of the polycrystalline silicon layer and also includes a second thin-film transistor section including a second channel region that is adjacent to the first channel region with an impurity-implanted region disposed therebetween. The first and second thin-film transistor sections are of the same conductivity type, the gate electrode of the first thin-film transistor section is electrically connected to the gate electrode of the second thin-film transistor section. The first thin-film transistor section has a channel length of less than 2 µm.

Since first and second thin-film transistor sections are connected to each other in series and the gate electrodes thereof are electrically connected to each other, the operating point is located near the pinch-off voltage of the second thin-film transistor section. A change in the drain current can be reduced in the saturation region due to a kink effect. The channel length of the first thin-film transistor section is set to less than 2 µm such that a short channel effect occurs. This allows the threshold voltage of the first thin-film transistor section 10a to be decreased. Therefore, the operating point can be set in a region where the voltage of a node disposed between the first and second thin-film transistor sections is high. In this region, a change in the drain current is small. Therefore, in the thin-film transistor as well as a structure including two thin-film transistors connected to each other in cascode, a change in the drain current can be reduced in the saturation region without using a bias-generating circuit. This leads to a great improvement in the saturation operation of the thin-film transistor.

In the semiconductor device, the channel length of the first thin-film transistor section is preferably 0.5 µm or more and less than 1.5 µm when the channel length of the first thin-film transistor section is less than 0.5 µm, the short channel effect is excessively strong and therefore the operating point moves to the region where the voltage of the node between the first and second thin-film transistor sections is high. This causes a kink effect in the second thin-film transistor section. However, when the channel length of the first thin-film transistor section is 0.5 µm or more and less than 1.5 µm, the operating point can be set in a region which is not affected by the kink effect of the second thin-film transistor section and which is sufficiently apart from the pinch-off voltage. Hence, the saturation operation of the thin-film transistor can be improved securely and greatly.

In the semiconductor device, the quotient obtained by dividing the channel width of the first thin-film transistor section by the channel length of the first thin-film transistor section is preferably four times or more greater than the quotient obtained by dividing the channel width of the second thin-film transistor section by the channel length of the second thin-film transistor section. This allows the first thin-film transistor section to be supplied with a large current to prevent the operating point from being located in the linear operation region of the second thin-film transistor section.

In the semiconductor device, at least one of the first and second thin-film transistor sections preferably includes a lightly doped drain region that is adjacent to a channel region on the drain side.

In the semiconductor device, the gate electrodes of the first and second thin-film transistor sections are preferably joined to each other so as to cover a zone extending from the first channel region to the second channel region with a gate-insulating layer disposed between each gate electrode and the first and second channel regions. This reduces the area occupied by the thin-film transistor.

In the semiconductor device, the impurity-implanted region preferably has low impurity concentration. This prevents large parasitic capacitors from being formed between the impurity-implanted region and the gate electrodes.

In the semiconductor device, the thin-film transistor preferably further includes a third thin-film transistor section disposed at a position which is located on the source side of the second thin-film transistor section and which is symmetrical to the position of the first thin-film transistor section. This enables the same operation even if the source-drain voltage is inverted. In this case, characteristics of a combination of the second and third thin-film transistor sections are substantially the same as those of a thin-film transistor with a large channel length; hence, advantages of the present invention are maintained.

The present invention provides a method for manufacturing the semiconductor device. The method includes a first impurity-implanting step in which after the polycrystalline silicon layer is formed above the substrate, impurity ions are implanted into the polycrystalline silicon layer using a mask covering a portion of the first channel region that extends from the source-side end of the first channel region toward the drain-side end thereof such that the position of the source-side end thereof is determined; a gate electrode-forming step which is subsequent to the first impurity-implanting step and in which the gate electrodes are formed; and a second impurity-implanting step in which the impurity ions are implanted into the polycrystalline silicon layer using the gate electrodes as masks such that the position of the drain-side end of the first channel region is determined. This allows the channel length of the first channel region to be determined by the position of the mask and the position of gate electrode of the first thin-film transistor section. In order to determine a zone for forming the first channel region by covering the zone with a resist mask, a high-resolution exposure system needs to be used. The high-resolution exposure system has low throughput because the area exposed with the high-resolution exposure system in one operation is small. However, the high-resolution exposure system need not be used in the method because the channel length of the first channel region can be determined by the position of the mask and the position of the gate electrode of the first thin-film transistor section. Therefore, a low-resolution exposure system can be used in the method. This increases the throughput of an exposure operation because the area exposed with the low-resolution exposure system in one operation is large.

The present invention provides another method for manufacturing the semiconductor device. The method includes a first impurity-implanting step in which after the polycrystalline silicon layer is formed above the substrate, first impurity ions are implanted into the polycrystalline silicon layer using a mask covering a portion of the first channel region that extends from the source-side end of the first channel region toward the drain-side end thereof such that a first conductive region is formed; a mask partly removing step in which the mask is partly removed so as to be downsized; a second impurity-implanting step in which second impurity ions are implanted into the polycrystalline silicon layer at the same dose as that of the first impurity ions using the mask downsized in the mask partly removing step such that the first conductive region is converted into an intrinsic region; a gate electrode-forming step which is subsequent to the second impurity-implanting step and in which the gate electrodes are formed; and a third impurity-implanting step in which the second impurity ions are implanted into the polycrystalline silicon layer using the gate electrodes as masks such that the position of the drain-side end of the first channel region is determined. This allows the channel length of the first channel region to be determined by the position of the mask and the position of gate electrode of the first thin-film transistor section. In order to determine a zone for forming the first channel region by covering the zone with a resist mask, a high-resolution exposure system needs to be used. The high-resolution exposure system has low throughput because the area exposed with the high-resolution exposure system in one operation is small. However, the high-resolution exposure system need not be used in this method because the channel length of the first channel region can be determined by the position of the mask and the position of the gate electrode of the first thin-film transistor section. Therefore, a low-resolution exposure system can be used in this method. This increases the throughput of an exposure operation because the area exposed with the low-resolution exposure system in one operation is large.

The present invention provides an electro-optical apparatus including the semiconductor device. The semiconductor device may be an element substrate having a plurality of pixels. The electro-optical apparatus can be used in a printer head. The semiconductor device can be used in a display for use in an electronic apparatus such as a mobile phone or a mobile computer. In the electro-optical apparatus, thin-film transistors identical to a thin-film transistor according to the present invention are used to drive organic EL elements in the pixels. The thin-film transistors can be used to form a driving circuit, such as an analogue circuit including an operational amplifier, placed above an element substrate used in a liquid crystal apparatus. The use of the thin-film transistors to drive the organic EL elements reduces the current leak during black display and enhances the contrast. The thin-film transistors are suitable for high-capacitance, large-screen displays because driving currents are not varied and therefore uniform images can be displayed even if the voltages of power supplies fluctuate due to the resistance of power supply lines in display panels. Output buffers having good linearity and a small offset can be manufactured in such a manner that the first thin-film transistors are incorporated in analogue circuits including operational, amplifiers. This leads to the development of high-quality liquid crystal displays. Offsets cause problems such as a flicker and image sticking. The present invention is effective in solving the problems.

BRIEF DESCRIPTION OF THE DRAWINGS

The present invention will be described with reference to the accompanying drawings, wherein like numbers reference like elements.

FIG. 2 is a sectional view of an element substrate including organic EL elements.

FIGS. 12A to 12C are illustrations showing a thin-film transistor with a multi-gate structure.

DESCRIPTION OF EXEMPLARY EMBODIMENTS

Embodiments of the present invention will now be described with reference to the accompanying drawings. In the accompanying drawings, in order to show layers and members on a recognizable scale, different scales are used depending on the size of the layers and members. In each embodiment, a semiconductor device including a thin-film transistor according to the present invention is described mainly using an organic EL including an element substrate (a semiconductor device) and thin-film transistors for driving organic EL elements.

First Embodiment

Configuration of Light-Emitting Apparatus

Figure 1A:
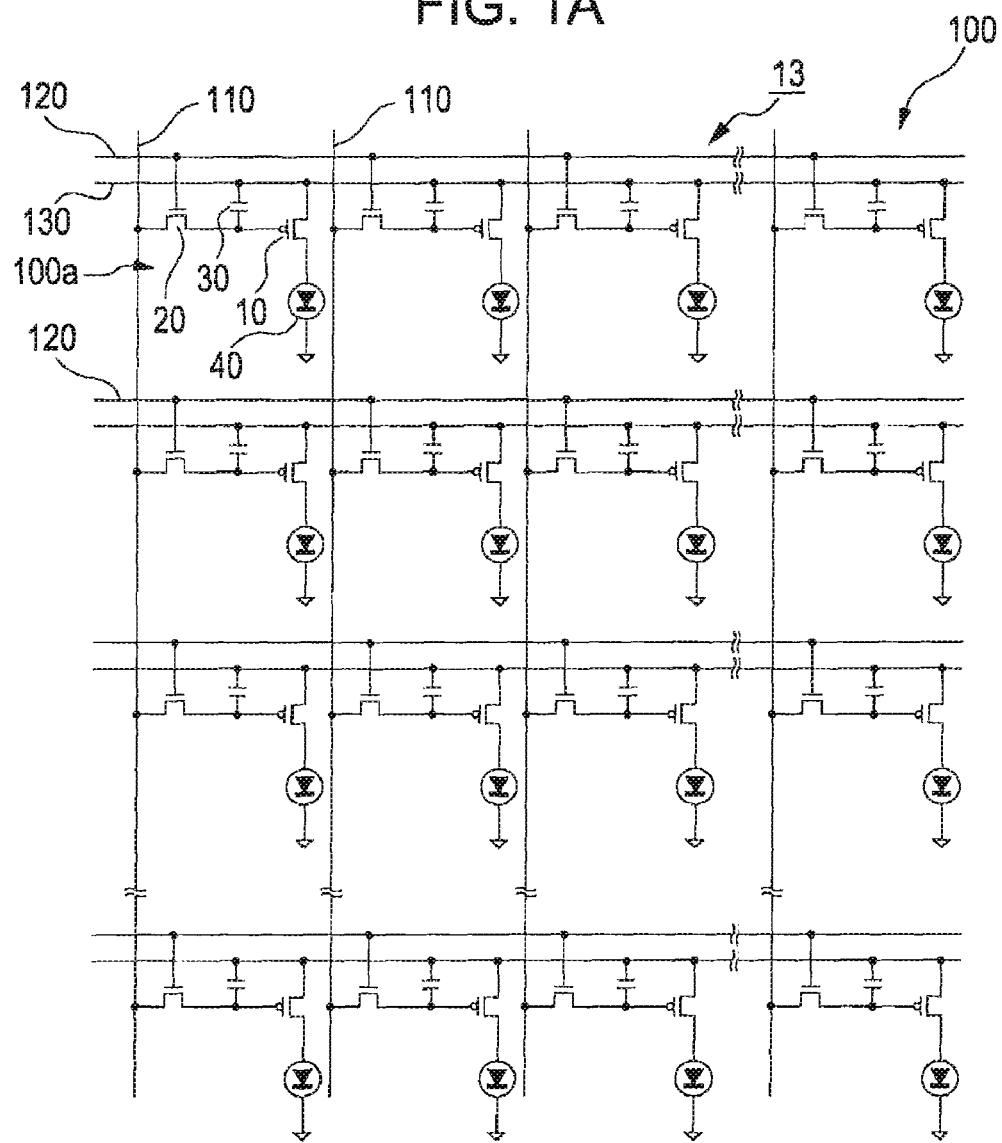
FIG. 1A is a block diagram showing the electrical configuration of an organic electroluminescent (EL) apparatus according to a first embodiment of the present invention and FIG. 1B is a diagram of an equivalent circuit of a first thin film transistor, used in the organic EL apparatus, for current control.
Figure 1B:
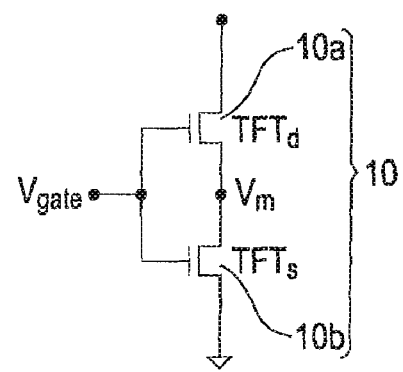

FIG. 1A is a block diagram of the electrical configuration of an organic EL apparatus according to a first embodiment of the present invention. FIG. 1B is a diagram of an equivalent circuit of one of first thin-film transistors 10 for current control. The light-emitting apparatus 100 includes the first thin-film transistors 10 and organic EL elements 40 driven or controlled with the first thin-film transistors 10. The organic EL elements 40 emit light when currents flow therethrough. Since the organic EL elements 40 emit light, the light-emitting apparatus 100 is advantageous in that the light-emitting apparatus 100 requires no backlight and has a wide viewing angle.

The light-emitting apparatus 100 includes an element substrate 13, a plurality of scanning lines 120, a plurality of data lines 110 extending in a direction intersecting with the direction in which the scanning lines 120 extend, a plurality of common power supply lines 130 extending in parallel to the scanning lines 120, pixels 100a corresponding to the intersections of the data and scanning lines 110 and 120, and a display region. The data lines 110, the scanning lines 120, the common power supply lines 130, and the pixels 100a are disposed above the element substrate 13. The pixels 100a are arranged in the display region in a matrix pattern. The following circuits are disposed above the element substrate 13: a data line-driving circuit (not shown) for driving the data lines 110 and a scanning line-driving circuit (not shown) for driving the scanning lines 120. The data line-driving circuit includes a shift register, a level shifter, a video line, and an analogue switch. The scanning line-driving circuit includes a shift register and a level shifter. The pixels 100a each include a second thin-film transistor 20 for switching each pixel 100a, a holding capacitor 30, one of the first thin-film transistors 10, and one of the organic EL elements 40. The second thin-film transistor 20 includes a gate electrode supplied with a scanning signal transmitted through one of the scanning lines 120. The holding capacitor 30 holds an image signal that is supplied from one of the data lines 110 with the second thin-film transistor 20 disposed therebetween. The gate of one of the first thin-film transistors 10 is supplied with the image signal held with the holding capacitor 30. The organic EL elements 40 are supplied with driving currents from the common power supply lines 130 when the organic EL elements 40 are electrically connected to the common power supply lines 130 with the first thin-film transistors 10 disposed therebetween.

Configuration of Element Substrate and Organic EL Elements

FIG. 2 is a sectional view of the element substrate 13, which includes the organic EL elements 40. With reference to FIG. 2, the organic EL elements 40 each include, in series, a pixel electrode 44 serving as an anode, a hole transport layer 46 for infecting and transporting holes supplied from the pixel electrode 44, a portion of a light emitting layer 47 (an organic functional layer) containing an organic EL material, a portion of an electron injection layer 48 for injecting and transporting electrons, and a portion of a cathode 49. When the light-emitting apparatus 100 is of a bottom emission type, the light emitted from the light-emitting layer 47 is extracted from the base side of the element substrate 13. Therefore, the element substrate 13 includes a transparent plate 15 which is made of glass, quartz, resin, or plastic and which serves as a base. A preferable example of the transparent plate 15 is a glass plate.

The element substrate 13 includes a circuit section 16. The circuit section 16 includes the data lines 110, the scanning lines 120, the common power supply lines 130, the second thin-film transistors 20, the holding capacitors 30, and the holding capacitors 30, these components being located under the organic EL elements 40 as shown in FIG. 1A.

Configuration of First Thin-Film Transistors

Figure 3A:
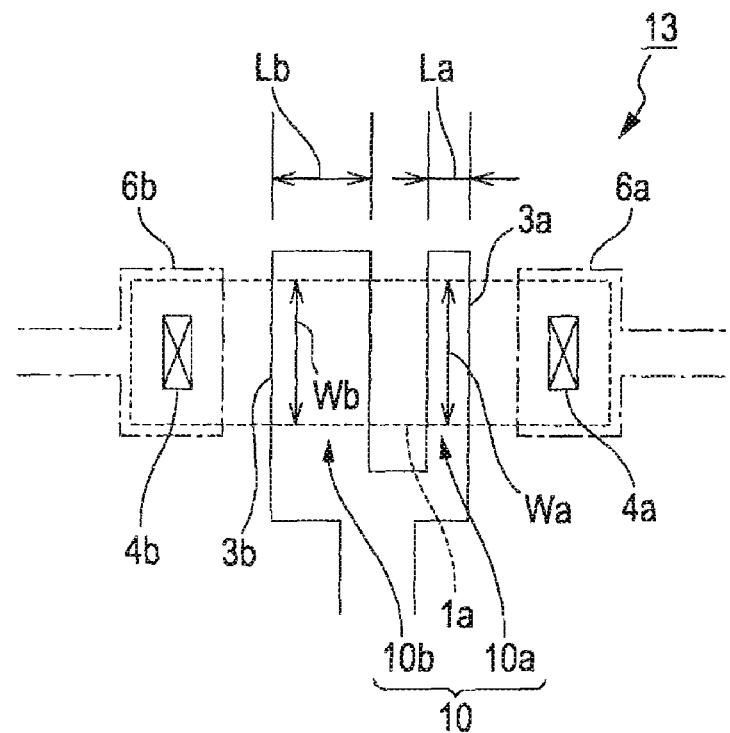
FIG. 3A is a plan view of the first thin-film transistor shown in FIG. 1B
Figure 3B:
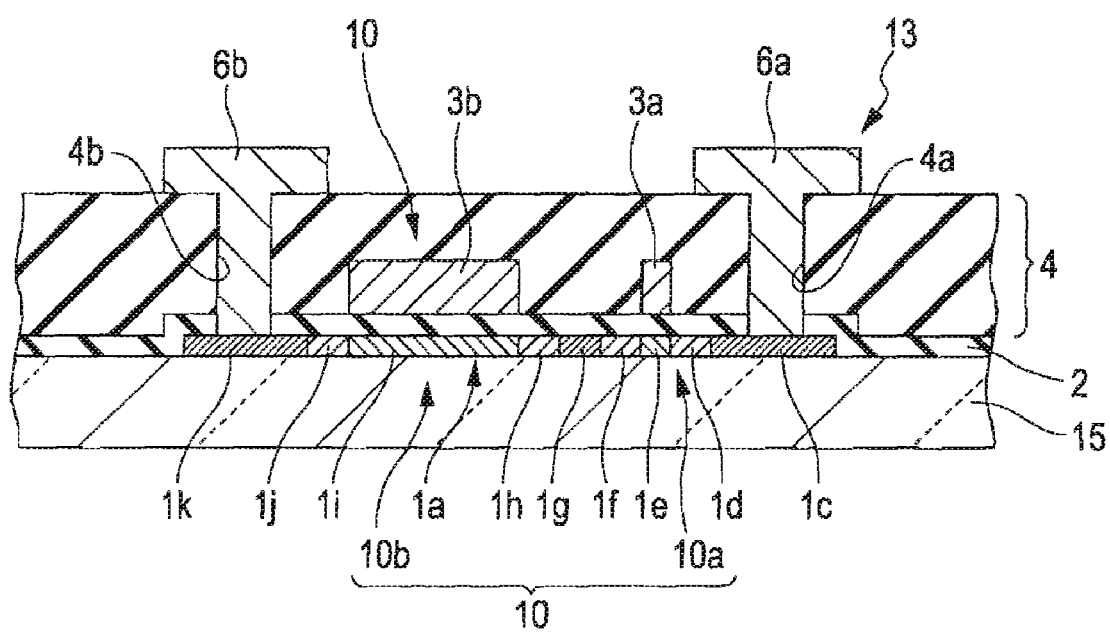
FIG. 3B is a sectional view of the first thin-film transistor.
Figure 4:
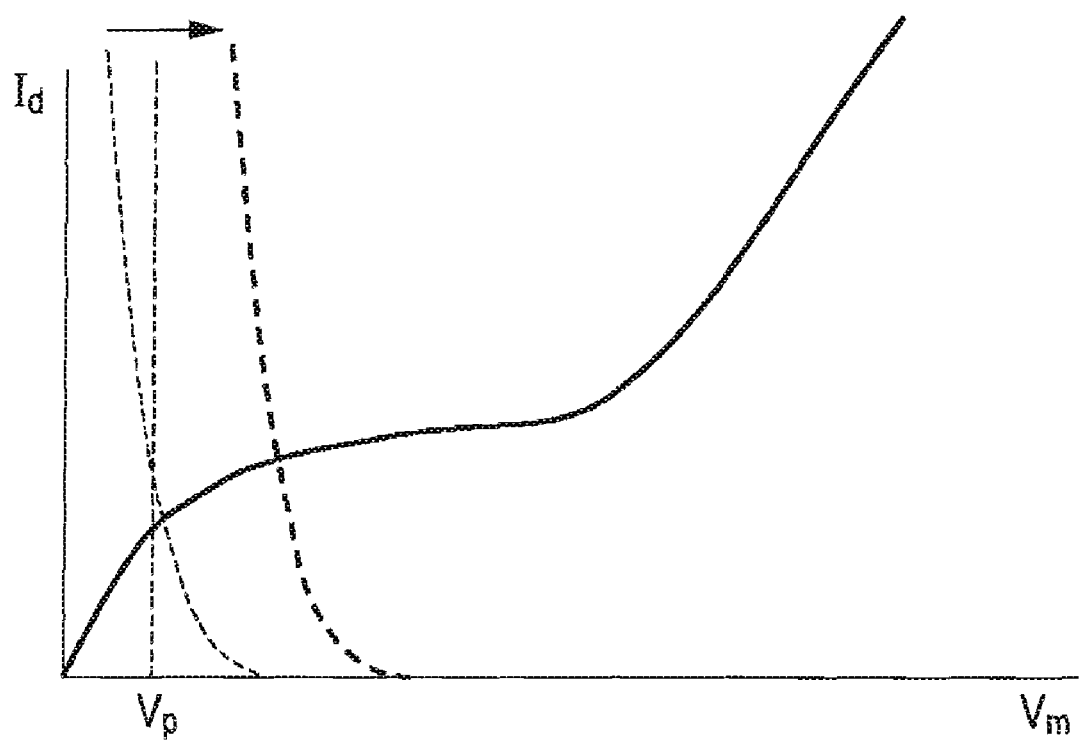
FIG. 4 is a graph showing current-voltage characteristics of two thin-film transistor sections included in the first thin-film transistor.

FIG. 3A is a plan view of one of the first thin-film transistors 10, which are disposed in the light-emitting apparatus 10 of this embodiment, FIG. 3B is a sectional view of this first thin-film transistor 10. FIG. 4 is a graph showing current-voltage characteristics of two thin-film transistor sections included in each thin-film transistor according to the present invention.

In this embodiment, the first thin-film transistors 10, which are shown in FIG. 1A, have a multi-gate structure (Structure D) describe with reference to FIGS. 12A, 12B and 12C. With reference to FIG. 1B, each first thin-film transistor 10 includes a drain-side thin-film sub-transistor TFT$_d$ and source-side thin-film sub-transistor TFT$_s$ connected to each other in series. The gates of the drain-side and source-side thin-film sub-transistors TFT$_d$ and TFT$_s$ are electrically connected to each other.

The element substrate 13 (semiconductor device) includes a base-protecting layer (not shown), such as a silicon dioxide layer or a silicon nitride layer, disposed on the transparent plate 15 and also includes a plurality of polycrystalline silicon layers 1a, arranged on the base-protecting layer in a dotted pattern, for forming the first thin-film transistors 10 as shown in FIGS. 3A and 3B. The polycrystalline silicon layers 1a can be formed in such a manner that amorphous silicon layers are formed on the base-protecting layer and then polycrystallized by laser annealing or lamp annealing. The polycrystalline silicon layers 1a are covered with a gate-insulating layer 2.

In this embodiment, a first thin-film transistor section 10a including a first channel region 1e is disposed in a drain-side portion of each polycrystalline silicon layer 1a. A second thin-film transistor section 10b including a second channel region 1i is disposed in a source-side portion of the polycrystalline silicon layer 1a. The first and second channel regions 1e and 1i are adjacent to each other with an impurity-implanted region disposed therebetween. The first thin-film transistor section 10a and the second thin-film transistor section 10b form each of the first thin-film transistors 10. The first thin-film transistor section 10a includes a first gate electrode 3a. The second thin-film transistor section 10b includes a second gate electrode 3b. The first and second gate electrodes 3a and 3b are disposed on the gate-insulating layer 2. The first and second gate electrodes 3a and 3b are joined to each other on one side of the polycrystalline silicon layer 1a and therefore can be electrically connected to each other.

The first and second thin-film transistor sections 10a and 10b each have an LDD structure. Therefore, the following regions are arranged in the polycrystalline silicon layer 1a in this order in the direction from the drain side to the source side: a first heavily doped n-type region 1c, a first lightly doped n-type region 1d, the first channel region 1e, a second lightly doped n-type region 1f, a second heavily doped n-type region 1g, a third lightly doped n-type region 1h, the second channel region 1i, a fourth lightly doped n-type region 1j, and a third heavily doped n-type region 1k. The first heavily doped n-type region 1c, the first lightly doped n-type region 1d, the first channel region 1e, the second lightly doped n-type region 1f, and the second heavily doped n-type region 1g form the first thin-film transistor section 10a. The second heavily doped n-type region 1g, the third lightly doped n-type region 1h, the second channel region 1i, the fourth lightly doped n-type region 1j, and the third heavily doped n-type region 1k form the second thin-film transistor section 10b. The second heavily doped n-type region 1g functions as a node between the first and second thin-film transistors 10a and 10b.

The first, second, third and fourth lightly doped n-type regions 1d, 1f, 1h, and 1j are formed in such a manner that n-type impurity ions such as phosphorus ions are implanted into the polycrystalline silicon layer 1a at a dose of about $0.1 \times 10^3/cm^2$ to $10 \times 10^{13}/cm^2$ using the first and second gate electrodes 3a and 3b as masks. Therefore, the first and second lightly doped n-type regions 1d and 1f are self-aligned with the first gate electrode 3a and the third and fourth lightly doped n-type regions 1h and 1j are self-aligned with the second gate electrode 3b. The first, second, and third heavily doped n-type regions 1c, 1g, and 1k are formed in such a manner that the n-type impurity ions are implanted into the polycrystalline silicon layer 1a at a dose of about $0.1 \times 10^{15}/cm^2$ to $10 \times 10^{15}/cm^2$ using a resist mask.

An interlayer insulating layer 4 overlies the first and second gate electrodes 3a and 3b and has first contact holes 4a and second contact holes 4b. The first heavily doped n-type region 1c is electrically connected to a drain electrode 6a through one of the first contact holes 4a and the third heavily doped n-type region 1k is electrically connected to a source electrode 6b through one of the second contact holes 4b.

In this embodiment, the channel length $L_a$ of the first thin-film transistor section 10a is less than 2 μm. In particular, the channel length $L_a$ thereof is 0.5 μm or more and less than 1.5 μm. The channel length $L_b$ of the second thin-film transistor section 10b is 8 μm or more. Therefore, the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b.

Since the first thin-film transistors 10 have Structure D describe with reference to FIGS. 12A, 12B, and 12C, the first thin-film transistor section 10a corresponds to the first thin-film transistor TFT$_d$ shown in FIG. 12A and the second thin-film transistor section 10b corresponds to the second thin-film transistor TFT$_d$ shown in FIG. 12A. The second heavily doped n-type region 1g corresponds to the node shown in FIG. 12A. Current-voltage characteristics of the first and second thin-film transistor sections 10a and 10b are as shown in FIG. 12B, the current-voltage characteristics being determined using the voltage of the node as a parameter. With reference to FIG. 12B, broken lines show current-voltage characteristic curves of the first thin-film transistor section 10a that have been obtained by varying the drain voltage. Nodes shown in FIG. 12B correspond to the operating currents of the first and second thin-film transistor sections 10a and 10b connected in series. As shown in FIG. 12C, the kink effect can be eliminated; hence, the saturation operation of the first thin-film transistor 10 can be improved.

Since the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b, the operating point of the first thin-film transistor section 10a is not in the linear operation region of the second thin-film transistor section 10b.

The channel length $L_a$ of the first thin-film transistor section 10a is less than 2 μm, that is, the channel length $L_a$ thereof is small. Therefore, when the first channel region 1e is depleted by the gate voltage, depletion layers each extend from the drain region (the first lightly doped n-type region 1d) or the source region (the second lightly doped n-type region 1f) and therefore the potential barrier of an end of the source region is reduced, that is, a short channel effect occurs. This allows the threshold voltage of the first thin-film transistor section 10a to decrease in the depletion direction. Therefore, current-voltage characteristics of the first thin-film transistor section 10a shift such that the node voltage $V_m$ increases as shown in FIG. 4. This allows the operating point to be located in a region sufficiently apart from the pinch-off voltage $V_p$ of the second thin-film transistor section 10b. In this region, the ratio of a change in the source-drain current $I_{ds}$ to a change in the source-drain voltage $V_{ds}$ is large. Therefore, in the first thin-film transistor 10 as well as a structure including two thin-film transistors connected to each other in cascode, a change in the drain current can be reduced in the saturation region. This leads to a great improvement in the saturation operation of the first thin-film transistor 10.

When the short channel effect is excessive, the operating point moves toward the node voltage $V_m$ and therefore the kink effect of the second thin-film transistor section 10b becomes significant. This reduces the range of the source-drain voltage $V_{ds}$. In this embodiment, since the channel length $L_a$ of the first thin-film transistor section 10a is 0.5 μm or more and less than 1.5 μm, the operating point can be set in a region which is not affected by the kink effect of the second thin-film transistor section 10b and which is sufficiently apart from the pinch-off voltage $V_p$. Hence, the saturation operation of the first thin-film transistor 10 can be improved securely and greatly.

Second Embodiment

FIGS. 5A to 5E are illustrations which show a method for manufacturing first thin-film transistors 10, used in a light-emitting apparatus according to a second embodiment of the present invention, for current control and which also show the configuration of each first thin-film transistor 10. The first thin-film transistors 10 of the second embodiment and those of third to fifth embodiments of the present invention have substantially the same configuration as that of the first thin-film transistors 10 of the first embodiment. Therefore, members common to these first thin-film transistors 10 have the same reference numerals and will not be described in detail.

Configuration

Figure 5A:
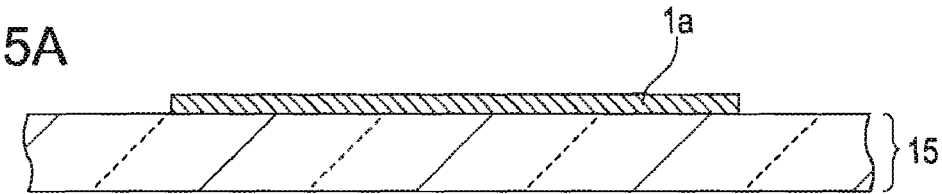
FIGS. 5A to 5E are illustrations which show a method for manufacturing first thin-film transistors; used in a light-emitting apparatus according to a second embodiment of the present invention, for current control and which also show the configuration of each first thin-film transistor.
Figure 5B:
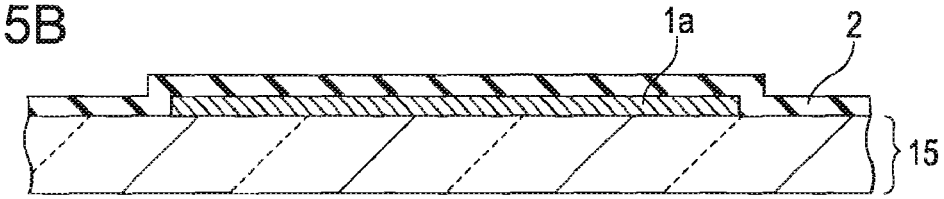
Figure 5C:
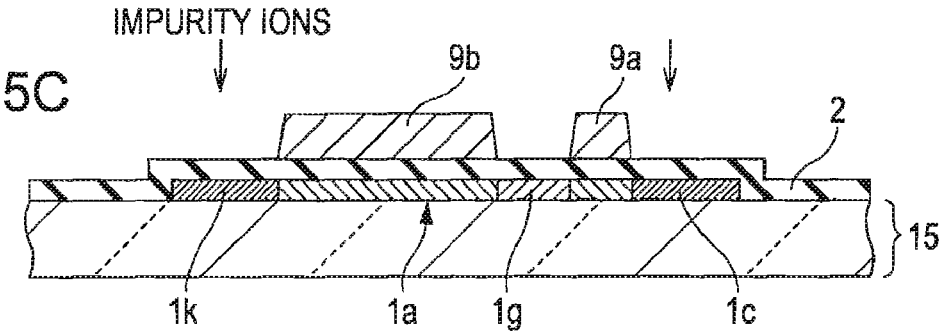
Figure 5D:
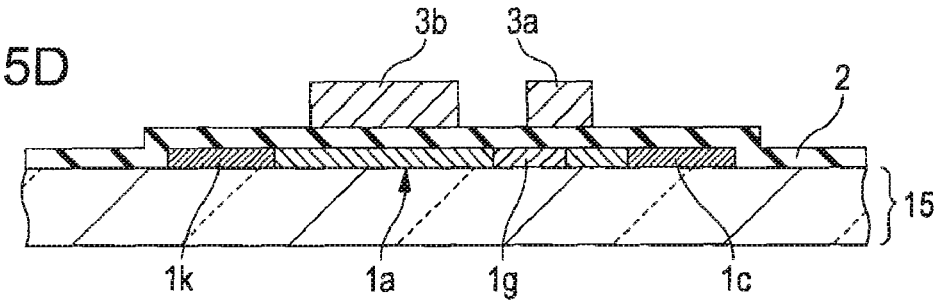
Figure 5E:
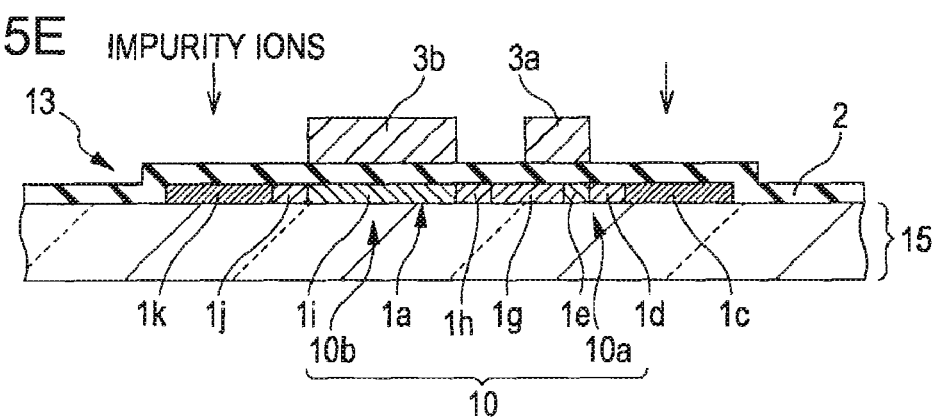

With reference to FIG. 5E, each first thin-film transistor 10, as well as that of the first embodiment, has the multi-gate structure (Structure D) described with reference to FIGS. 12A, 12B, and 12C. In order to achieve the multi-gate structure, polycrystalline silicon layers 1a are formed above a transparent plate 15, included in an element substrate 13 serving as a base in a dotted pattern and then processed such that first thin-film transistor sections 10a and second thin-film transistor sections 10b are formed. Each first thin-film transistor section 10a is located on the drain side and each second thin-film transistor section 10b is located on the source side. In this embodiment as well as the first embodiment, the polycrystalline silicon layers 1a are formed in such a element substrate 13 and then polycrystallized by laser annealing or lamp annealing.

The first thin-film transistor section 10a includes a first gate electrode 3a. The second thin-film transistor section 10b includes a second gate electrode 3b. The first and second gate electrodes 3a and 3b are disposed on a gate-insulating layer 2. The first and second gate electrodes 3a and 3b are joined to each other on one side of each of the polycrystalline silicon layers 1a and therefore can be electrically connected to each other.

The first and second thin-film transistor sections 10a and 10b have an LDD structure. The first thin-film transistor section 10a includes no lightly doped n-type region on the source side but a first lightly doped n-type region 1d located on the drain side. The second thin-film transistor section 10b includes a third lightly doped n-type region 1h located on the drain side and a fourth lightly doped n-type region 1j located on the source side. Therefore, the following regions are arranged in each polycrystalline silicon layer 1a in this order in the direction from the drain side to the source side: a first heavily doped n-type region 1c, the first lightly doped n-type region 1d, a first channel region 1e, a second heavily doped n-type region 1g, the third lightly doped n-type region 1h, a second channel region 1i, the fourth lightly doped n-type region 1j, and a third heavily doped n-type region 1k. The first heavily doped n-type region 1c, the first lightly doped n-type region 1d, the first channel region 1e, and the second heavily doped n-type region 1g form the first thin-film transistor section 10a. The second heavily doped n-type region 1g, the third lightly doped n-type region 1h, the second channel region 1i, the fourth lightly doped n-type region 1j, and the third heavily doped n-type region 1k form the second thin-film transistor section 10b. The second heavily doped n-type region 1g functions as a node between the first and second thin-film transistors 10a and 10b.

The first lightly doped n-type region 1d is self-aligned with the first gate electrode 3a, which partly overlaps with the second heavily doped n-type region 1g with the gate-insulating layer 2 disposed therebetween. The third and fourth lightly doped n-type regions 1h and 1j are self-aligned with the second gate electrode 3b.

In the first thin-film transistor 10 as well as that of the first embodiment, the channel length $L_a$ of the first thin-film transistor section 10a is less than 2 μm. In particular, the channel length $L_a$ thereof is 0.5 μm or more and less than 1.5 μm. The channel length $L_b$ of the second thin-film transistor section 10b is 8 μm or more. Therefore, the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b.

Since the first thin-film transistor 10 has the multi-gate structure described with reference to FIGS. 12A, 12B, and 12C as described above, a kink effect can be prevented and therefore the saturation operation can be improved. Furthermore, since the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b, the operating point of the first thin-film transistor section 10a is not in the linear operation region of the second thin-film transistor section 10b. The channel length $L_a$ of the first thin-film transistor section 10a is less than 2 μm, that is, the channel length $L_a$ thereof is small; hence, the threshold voltage of the first thin-film transistor section 10a decreases in the depletion direction because of a short channel effect. Therefore, current-voltage characteristics of the first thin-film transistor section 10a ($TFT_d$) shift such that the node voltage $V_m$ increases as shown in FIG. 4. This allows the operating point to be located in a region sufficiently apart from the pinch-off voltage $V_p$ of the second thin-film transistor section 10b ($TFT_s$). In this region, the ratio of a change in the source-drain current $I_{ds}$ to a change in the source-drain voltage $V_{ds}$ is large. Therefore, in the first thin-film transistor 10 as well as a structure including two thin-film transistors connected to each other in cascode, a change in the drain current can be reduced in the saturation region. This leads to a great improvement in the saturation operation of the first thin-film transistor 10. Since the channel length $L_a$ of the first thin-film transistor section 10a is 0.5 μm or more and less than 1.5 µm, the operating point can be set in a region which is not affected by the kink effect of the second thin-film transistor section 10b and which is sufficiently apart from the pinch-off voltage $V_p$. Hence, the saturation operation of the first thin-film transistor 10 can be improved securely and greatly.

Manufacturing Method

A method for manufacturing the first thin-film transistors 10 will now be described. As shown in FIG. 5A, the transparent plate 15, which is made of glass or the like, is ultrasonically cleaned. A base-protecting layer (not shown) made of silicon oxide is provided over the transparent plate 15 at a substrate temperature of 150° C. to 450° C. by a plasma-enhanced chemical vapor deposition (PECVD) process as required.

An amorphous silicon layer is formed over the transparent plate 15 at a substrate temperature of 150° C. to 450° C. by a PECVD process so as to have a thickness of, for example, 40 to 50 nm and then polycrystallized by a laser annealing process or a rapid heating process. The resulting silicon layer is patterned into the polycrystalline silicon layers 1a, which are arranged in a dotted pattern, by photolithography.

As shown in FIG. 5B, a gate-insulating layer 2 is formed over the polycrystalline silicon layers 1a by a chemical vapor deposition (CVD) process. The gate-insulating layer 2 is made of silicon oxide and has a thickness of, for example, 75 nm.

In a first impurity-implanting step shown in FIG. 5C, a first resist mask 9a and a second resist mask 9b are formed on the gate-insulating layer 2, n-type impurity ions such as phosphorus ions are implanted into each polycrystalline silicon layer 1a at a dose of about $0.1 \times 10^{15}/cm^2$ to $10 \times 10^{15}/cm^2$, and the first and second resist masks 9a and 9b are then removed. The first resist mask 9a is placed at a position overlapping with a zone for forming the first lightly doped n-type region 1d and the first channel region 1e as shown in FIG. 5E. The second resist mask 9b is placed at a position overlapping with a zone for forming the third lightly doped n-type region 1h, the second channel region 1i, and the fourth lightly doped n-type region 1j as shown in FIG. 5E. Therefore, the first, second, and third heavily doped n-type regions 1c, 1g, and 1k are formed in the polycrystalline silicon layer 1a.

In a gate electrode-forming step shown in FIG. 5D, the following layer or film is formed over the gate-insulating layer 2: any one of a molybdenum layer, an aluminum layer, a titanium layer, a tungsten layer, and a tantalum layer or a multilayer film including some of these layers. The above layer or film is patterned into the first gate electrodes 3a and the second gate electrodes 3b by photolithography. Each second gate electrode 3b is located at a position overlapping with a zone for forming the second channel region 1i shown in FIG. 5E. Each first gate electrode 3a is located at a position overlapping with a zone which includes a sub-zone for forming the first channel region 1e shown in FIG. 5E and which extends to an intermediate portion of the second heavily doped n-type region 1g from the sub-zone.

In a second impurity-implanting step shown in FIG. 5E, the n-type impurity ions are implanted into the polycrystalline silicon layer 1a at a dose of about $0.1 \times 10^{13}/cm^2$ to $10 \times 10^{13}/cm^2$ using the first and second gate electrodes 3a and 3b as masks. This allows the first channel region 1e and the second channel region 1i to be formed in a zone covered with the first gate electrode 3a and a zone covered with the second gate electrode 3b, respectively, and also allows the first, second, and fourth lightly doped n-type regions 1d, 1h, and 1j to be formed such that the first, second, and fourth lightly doped n-type regions 1d, 1h, and 1j are self-aligned with the first and second gate electrodes 3a and 3b.

The first thin-film transistors 10, which include the first and second thin-film transistor sections 10a and 10b, are fabricated as described above. After the n-type impurity ions are implanted into the polycrystalline silicon layer 1a, the element substrate 13 may be heated such that the implanted impurity ions are activated. The first impurity-implanting step shown in FIG. 5C may be prior to the formation of the formation of the gate-insulating layer 2. Hydrogen ions may be implanted into the polycrystalline silicon layer 1a by ion shower doping such that dangling bonds present in the polycrystalline silicon layer 1a are terminated.

According to the manufacturing method of this embodiment, in the first impurity-implanting step shown in FIG. 5C, the position of the source-side end of the first channel region 1e is determined in such a manner that the n-type impurity ions are implanted into the polycrystalline silicon layer 1a using the first resist mask 9a which covers a portion of the first channel region 1e that extends from the source-side end thereof toward the drain-side end thereof. In the second impurity-implanting step shown in FIG. 5E, the position of the drain-side end of the first channel region 1e is determined in such a manner that the n-type impurity ions are implanted into the polycrystalline silicon layer 1a using the first gate electrode 3a as a mask. Therefore, the channel length of the first channel region 1e can be determined by the position of the first resist mask 9a and the position of the first gate electrode 3a. In order to determine the zone for forming the first channel region 1e by covering this zone with an ordinary resist mask, the polycrystalline silicon layer 1a needs to be exposed with a high-resolution exposure system, which has low throughput because the area exposed with the high-resolution exposure system in one operation is small. However, the high-resolution exposure system need not be used in the manufacturing method because the channel length of the first channel region 1e can be determined by the position of the first resist mask 9a and the position of the first gate electrode 3a. Therefore, a low-resolution exposure system can be used in the manufacturing method. This increases the throughput of an exposure operation because the area exposed with the low-resolution exposure system in one operation is large.

Third Embodiment

FIGS. 6A to 6D are illustrations which show a method for manufacturing first thin-film transistors 10, used in a light-emitting apparatus according to a third embodiment of the present invention, for current control and which also show the configuration of each first thin-film transistor 10.

Configuration

The first thin-film transistor 10, as well as that of the first embodiment, shown in FIG. 6D has the multi-gate structure (Structure D) described with reference to FIGS. 12A, 12B and 12C. In order to achieve the multi-gate structure, polycrystalline silicon layers 1a are formed above a transparent plate 15, included in an element substrate 13, serving as a base in a dotted pattern and then processed such that first thin-film transistor sections 10a and second thin-film transistor sections 10b are formed. Each first thin-film transistor section 10a is located on the drain side and each second thin-film transistor section 10b is located on the source side. In this embodiment as well as the first embodiment, the polycrystalline silicon layers 1a are formed in such a mariner that amorphous silicon layers are formed above the element substrate 13 and then polycrystallized by laser annealing or lamp annealing.

A gate electrode 3c that is common to the first thin-film transistor sections 10a and 10b is disposed on a gate-insulating layer 2. That is, each first thin-film transistor 10 and each second thin-film transistor section 10b have no individual gate electrode but share the gate electrode 3c. The gate electrode 3c covers a zone extending from each first channel region 1e to each second channel region 1i with the gate-insulating layer 2 disposed therebetween.

The first thin-film transistor section 10a has an LDD structure. The first thin-film transistor section 10a includes no lightly doped n-type region on the source side but a first lightly doped n-type region 1d located on the drain side. The second thin-film transistor section 10b includes no lightly doped n-type region on the drain side but a fourth lightly doped n-type region 1j located on the source side. Therefore, the following regions are arranged in each polycrystalline silicon layer 1a in this order in the direction from the drain side to the source side: a first heavily doped n-type region 1c, the first lightly doped n-type region 1d, the first channel region 1e, a second heavily doped n-type region 1g, the second channel region 1i, the fourth lightly doped n-type region 1j, and a third heavily doped n-type region 1k. The first heavily doped n-type region 1c, the first lightly doped n-type region 1d, the first channel region 1e, and the second heavily doped n-type region 1g form the first thin-film transistor section 10a. The second heavily doped n-type region 1g, the second channel region 1i, the fourth lightly doped n-type region 1j, and the third heavily doped n-type region 1k form the second thin-film transistor section 10b. The second heavily doped n-type region 1g functions as a node between the first and second thin-film transistors 10a and 10b.

The first and fourth lightly doped n-type regions 1d and 1j are self-aligned with the gate electrode 3c. The gate electrode 3c extends over the first channel region 1e, the second heavily doped n-type region 1g, and the second channel region 1i with the gate-insulating layer 2 disposed between the gate electrode 3c and these regions.

In the first thin-film transistor 10 as well as that of the first embodiment, the channel length $L_a$ of the first thin-film transistor section 10a is less than 2 μm. In particular, the channel length $L_a$ thereof is 0.5 μm or more and less than 1.5 μm. The channel length $L_b$ of the second thin-film transistor section 10b is 8 μm or more. Therefore, the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b.

Since the first thin-film transistor 10 has the multi-gate structure described with reference to FIGS. 12A, 12B, and 12C as described above, a kink effect can be prevented and therefore the saturation operation can be improved. Furthermore, since the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b, the operating point of the first thin-film transistor section 10a is not in the linear operation region of the second thin-film transistor section 10b. The channel length $L_a$ of the first thin-film transistor section 10a is less than 2 μm, that is, the channel length $L_a$ thereof is small; hence, the threshold voltage of the first thin-film transistor section 10a decreases in the depletion direction because of a short channel effect. Therefore, current-voltage characteristics of the first thin-film transistor section 10a (TFT$_d$) shift such that the node voltage $V_m$ increases as shown in FIG. 4. This allows the operating point to be located in a region sufficiently apart from the pinch-off voltage $V_p$ of the second thin-film transistor section 10b (TFT$_s$). In this region, the ratio of a change in the source-drain current $I_{ds}$ to a change in the source-drain voltage $V_{ds}$ is large. Therefore, in the first thin-film transistor 10 as well as a structure including two thin-film transistors connected to each other in cascode, a change in the drain current can be reduced in the saturation region. This leads to a great improvement in the saturation operation of the first thin-film transistor 10. Since the channel length $L_a$ of the first thin-film transistor section 10a is 0.5 μm or more and less than 1.5 μm, the operating point can be set in a region which is not affected by the kink effect of the second thin-film transistor section 10b and which is sufficiently apart from the pinch-off voltage $V_p$. Hence, the saturation operation of the first thin-film transistor 10 can be improved securely and greatly.

Manufacturing Method

Figure 6A:
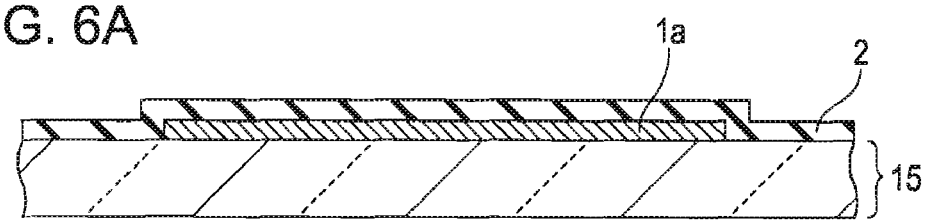
FIGS. 6A to 6D are illustrations which show a method for manufacturing first thin-film transistors, used in a light-emitting apparatus according to a third embodiment of the present invention, for current control and which also show the configuration of each first thin-film transistor.

A method for manufacturing the first thin-film transistors 10 will now be described. As shown in FIG. 6A, the polycrystalline silicon layers 1a are formed in a dotted pattern and the gate-insulating layer 2 is formed over the polycrystalline silicon layers 1a in the same manner as that described in the second embodiment.

Figure 6B:
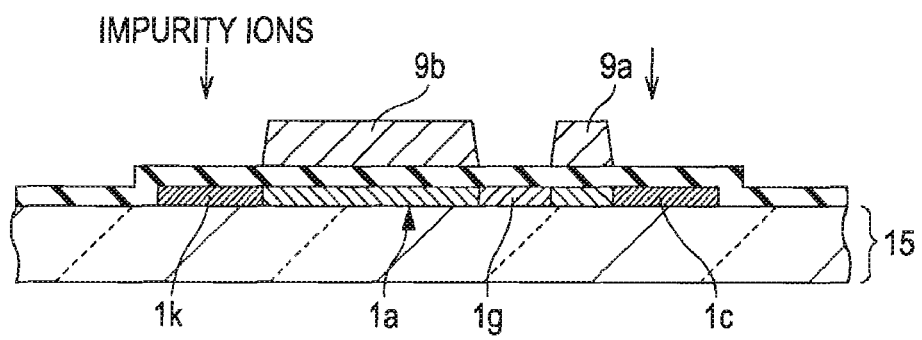

In a first impurity-implanting step shown in FIG. 6B, a first resist mask 9a and a second resist mask 9b are formed on the gate-insulating layer 2, n-type impurity ions such as phosphorus ions are implanted into each polycrystalline silicon layer 1a at a dose of about $0.1 \times 10^{15}/cm^2$ to $10 \times 10^{15}/cm^2$, and the first and second resist masks 9a and 9b are then removed. The first resist mask 9a is placed at a position overlapping with a zone for forming the first lightly doped n-type region 1d and the first channel region 1e as shown in FIG. 6D. The second resist mask 9b is placed at a position overlapping with a zone for forming the second channel region 1i and the fourth lightly doped n-type region 1j as shown in FIG. 6D. Therefore, the first, second, and third heavily doped n-type regions 1c, 1g, and 1k are formed in the polycrystalline silicon layer 1a.

Figure 6C:
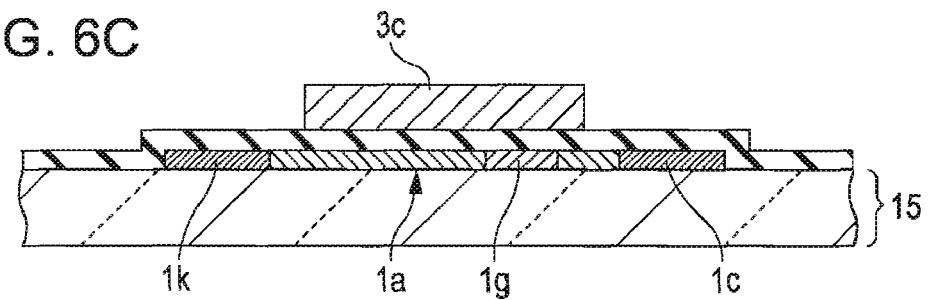

In a gate electrode-forming step shown in FIG. 6C, a metal layer is formed over the gate-insulating layer 2 and then patterned into the gate electrodes 3c by photolithography. Each gate electrode 3c is located at a position overlapping with a zone for forming the first channel region 1e, the second heavily doped n-type region 1g, and the second channel region 1i as shown in FIG. 6D.

Figure 6D:
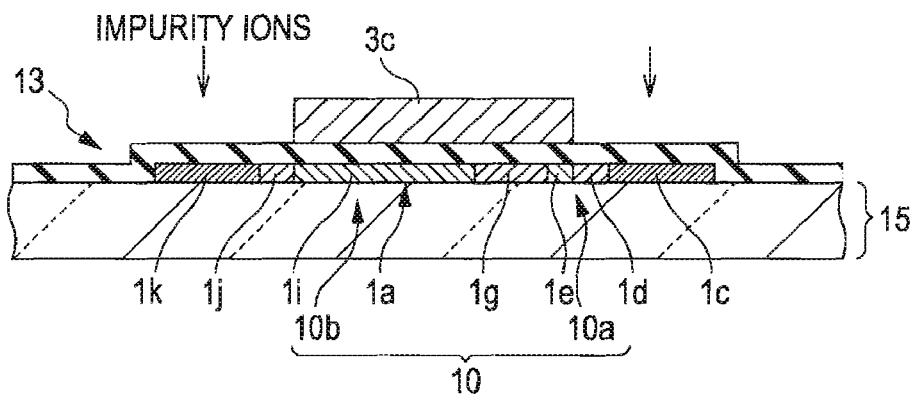

In a second impurity-implanting step shown in FIG. 6D, the n-type impurity ions are implanted into the polycrystalline silicon layer 1a at a dose of about $0.1 \times 10^3/cm^2$ to $10 \times 10^3/cm^2$ using the gate electrode 3c as a mask. This allows the first and second channel regions 1e and 1i to be formed in a zone covered with the gate electrode 3c and also allows the first and fourth lightly doped n-type regions 1d and 1j to be formed such that the first and fourth lightly doped n-type regions 1d and 1j are self-aligned with the gate electrode 3c.

The first thin-film transistors 10, which include the first and second thin-film transistor sections 10a and 10b, are fabricated as described above. Steps subsequent to the fabrication of the first thin-film transistors 10 are the same as those described in the second embodiment and therefore are not described.

According to the manufacturing method of this embodiment, in the first impurity-implanting step shown in FIG. 6B, the position of the source-side end of the first channel region 1e is determined in such a manner that the n-type impurity ions are implanted into the polycrystalline silicon layer 1a using the first resist mask 9a, which covers a portion of the first channel region 1e that extends from the source-side end thereof toward the drain-side end thereof. In the second impurity-implanting step shown in FIG. 6D, the position of the drain-side end of the first channel region 1e is determined in such a manner that the n-type impurity ions are implanted into the polycrystalline silicon layer 1a using the gate electrode 3c as a mask. Therefore, the channel length of the first channel region 1e can be determined by the position of the first resist mask 9a and the position of the gate electrode 3c. In the manufacturing method, a low-resolution exposure system can be used. This increases the throughput of an exposure operation because the area exposed with the low-resolution exposure system in one operation is large.

Fourth Embodiment

FIGS. 7A to 7D are illustrations which show a method for manufacturing first thin-film transistors 10, used in a light-emitting apparatus according to a fourth embodiment of the present invention, for current control, and which also show the configuration of each first thin-film transistor 10.

Configuration

The first thin-film transistor 10, as well as that of the first embodiment, shown in FIG. 6D has the multi-gate structure (Structure D) described with reference to FIGS. 12A, 12B, and 12C. In order to achieve the multi-gate structure, polycrystalline silicon layers 1a are formed above a transparent plate 15, included in an element substrate 13, serving as a base in a dotted pattern and then processed such that first thin-film transistor sections 10a and second thin-film transistor sections 10b are formed. Each first thin-film transistor section 1a is located on the drain side and each second thin-film transistor section 10b is located on the source side. In this embodiment as well as the first embodiment, the polycrystalline silicon layers 1a are formed in such a manner that amorphous silicon layers are formed above the element substrate 13 and then polycrystallized by laser annealing or lamp annealing. A third thin-film transistor section 10c is formed on the source side of the second thin-film transistor section 10b so as to be located at a posit ion symmetrical to the position of the first thin-film transistor section 10a.

A gate electrode 3c that is common to the first, second, and third thin-film transistor sections 10a, 10b, and 10c is disposed on a gate-insulating layer 2.

The first thin-film transistor section 10a has an LDD structure. The first thin-film transistor section 10a includes no lightly doped n-type region on the source side but a first lightly doped n-type region 1d located on the drain side. The second thin-film transistor section 10b includes no lightly doped n-type region on the drain or source side. The third thin-film transistor section 10c includes no lightly doped n-type region on the drain side but a fifth lightly doped n-type region 1m located on the source side. Therefore, the following regions are arranged in each polycrystalline silicon layer 1a in this order in the direction from the drain side to the source side: a first heavily doped n-type region 1c, the first lightly doped n-type region 1d, a first channel region 1e, a second heavily doped n-type region 1g, a second channel region 1i, a third heavily doped n-type region 1k, a third channel region 1l, the fifth lightly doped n-type region 1m, and a fourth heavily doped n-type region 1n. The first heavily doped n-type region 1c, the first lightly doped n-type region 1d, the first channel region 1e, and the second heavily doped n-type region 1g form the first thin-film transistor section 10a. The second heavily doped n-type region 1g, the second channel region 1i, and the third heavily doped n-type region 1k form the second thin-film transistor section 10b. The third heavily doped n-type region 1k, the third channel region 1l, the fifth lightly doped n-type region 1m, and the fourth heavily doped n-type region 1n form the third thin-film transistor section 10c. The second heavily doped n-type region 1g functions as a node between the first and second thin-film transistors 10a and 10b.

The first and fifth lightly doped n-type regions 1d and 1m are self-aligned with the gate electrode 3c. The gate electrode 3c extends over the first channel region 1e, the second heavily doped n-type region 1g, the second channel region 1i, the third heavily doped n-type region 1k, and the third channel region 1l with the gate-insulating layer 2 disposed between the gate electrode 3c and these regions.

In the first thin-film transistor 10 as well as that of the first, second, or third embodiment, the channel length $L_a$ of the first thin-film transistor section 10a is less than 2 μm. In particular, the channel length $L_a$ thereof is 0.5 μm or more and less than 1.5 μm. The channel length $L_b$ of the second thin-film transistor section 10b is 8 μm or more. Therefore, the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b.

The channel length $L_c$ of the third thin-film transistor section 10c, which is located at the position symmetrical to the position of the first thin-film transistor section 10a, is less than 2 μm. In particular, the channel length $L_c$ thereof is 0.5 μm or more and less than 1.5 μm. Therefore, the quotient $W_c/L_c$ obtained by dividing the channel width $W_c$ of the third thin-film transistor section 10c by the channel length $L_c$ of the third thin-film transistor section 10c is four times or more greater than the quotient $W_b/L_b$ obtained by dividing the channel width $W_b$ of the second thin-film transistor section 10b by the channel length $L_b$ of the second thin-film transistor section 10b.

Since the first thin-film transistor 10 has the multi-gate structure described with reference to FIGS. 12A, 12B, and 12C as described above, a kink effect can be prevented and therefore the saturation operation can be improved. Furthermore, since the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b, the operating point of the first thin-film transistor section 10a is not in the linear operation region of the second thin-film transistor section 10b. The channel length $L_a$ of the first thin-film transistor section 10a is less than 2 μm, that is, the channel length $L_a$ thereof is small; hence, the threshold voltage of the first thin-film transistor section 10a decreases in the depletion direction because of a short channel effect. Therefore, current-voltage characteristics of the first thin-film transistor section 10a (TFT$_d$) shift such that the node voltage $V_m$ increases as shown in FIG. 4. This allows the operating point to be located in a region sufficiently apart from the pinch-off voltage $V_p$ of the second thin-film transistor section 10b (TFT$_s$). In this region, the ratio of a change in the source-drain current $I_{ds}$ to a change in the source-drain voltage $V_{ds}$ is large. Therefore, in the first thin-film transistor 10 as well as a structure including two thin-film transistors connected to each other in cascode, a change in the drain current can be reduced in the saturation region. This leads to a great improvement in the saturation operation of the first thin-film transistor 10. Since the channel length $L_a$ of the first thin-film transistor section 10a is 0.5 μm or more and less than 1.5 μm the operating point can be set in a region which is not affected by the kink effect of the second thin-film transistor section 10b and which is sufficiently apart from the pinch-off voltage $V_p$. Hence, the saturation operation of the first thin-film transistor 10 can be improved securely and greatly.

Since the third thin-film transistor section 10c is disposed on the source side of the second thin-film transistor sections 10b and is located at the position symmetrical to the position of the first thin-film transistor section 10a, the kink effect can be prevented and therefore the saturation operation can be improved even if the source-drain voltage is inverted.

Manufacturing Method

Figure 7A:
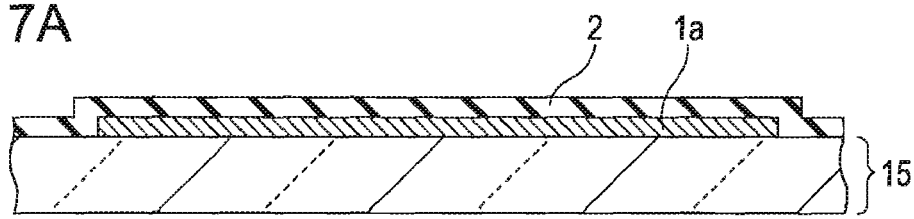
FIGS. 7A to 7D are illustrations which show a method for manufacturing first thin-film transistors, used in a light-emitting apparatus according to a fourth embodiment of the present invention, for current control and which also show the configuration of each first thin-film transistor.

A method for manufacturing the first thin-film transistors 10 will now be described. As shown in FIG. 7A, the polycrystalline silicon layers 1a are formed in a dotted pattern and the gate-insulating layer 2 is formed over the polycrystalline silicon layers 1a in the same manner as that described in the second embodiment.

Figure 7B:
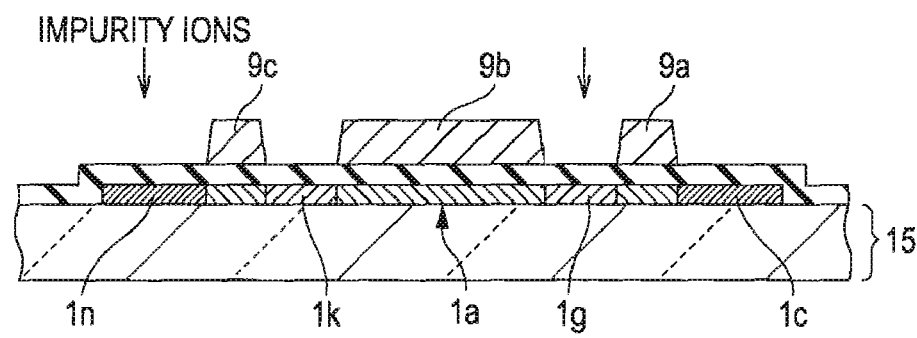

In a first impurity-implanting step shown in FIG. 7B, a first resist mask 9a, a second resist mask 9b, and a third resist mask 9c are formed on the gate-insulating layer 2, n-type impurity ions are implanted into each polycrystalline silicon layer 1a at a dose of about $0.1 \times 10^{15}/cm^2$ to $10 \times 10^{15}/cm^2$, and the first, second, third resist masks 9a, 9b, and 9c are then removed. The first resist mask 9a is placed at a position overlapping with a zone for forming the first lightly doped n-type region 1d and the first channel region 1e as shown in FIG. 7D. The second resist mask 9b is placed at a position overlapping with a zone for forming the second channel region 1i as shown in FIG. 7D. The third resist mask 9c is placed at a position overlapping with a zone for forming the third channel region 1l and the fifth lightly doped n-type region 1m as shown in FIG. 7D. Therefore, the first, second, third, fourth heavily doped n-type region 1c, 1g, 1k, and 1n are formed in the polycrystalline silicon layer 1a.

Figure 7C:
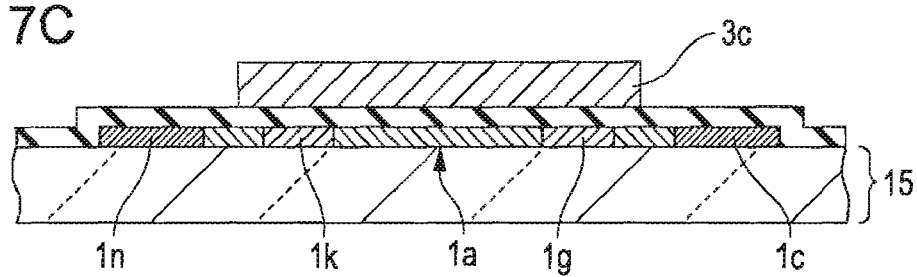
Figure 7D:
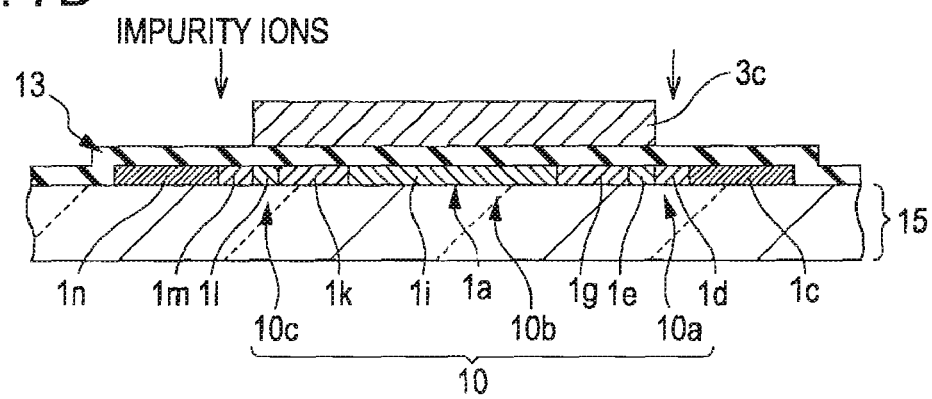

In a gate electrode-forming step shown in FIG. 7C, a metal layer is formed over the gate-insulating layer 2 and then patterned into the gate electrodes 3c by photolithography. Each gate electrode 3c is located at a position overlapping with a zone for forming the first channel region 1e, the second heavily doped n-type region 1g, the second channel region 1i, the third heavily doped n-type region 1k, and the fifth lightly doped n-type region 1m as shown in FIG. 7D.

In a second impurity-implanting step shown in FIG. 7D, the n-type impurity ions are implanted into the polycrystalline silicon layer 1a at a dose of about $0.1 \times 10^{13}/cm^2$ to $10 \times 10^{13}/cm^2$ using the gate electrode 3c as a mask. This allows the first, second, and third channel regions 1e, 1i, and 1l to be formed in a zone covered with the gate electrode 3c and also allows the first and fifth lightly doped n-type regions 1d and 1m to be formed such that the first and fifth lightly doped n-type regions 1d and 1m are self-aligned with the gate electrode 3c.

The first thin-film transistors 10, which include the first, second, and third thin-film transistor sections 10a, 10b, and 10c, are fabricated as described above. Steps subsequent to the fabrication of the first thin-film transistors 10 are the same as those described in the second embodiment and therefore are not described.

According to the manufacturing method of this embodiment, in the first impurity-implanting step shown in FIG. 7B, the position of the source-side end of the first channel region 1e is determined in such a manner that the type impurity ions are implanted into the polycrystalline silicon layer 1a using the first resist mask 9a, which covers a portion of the first channel region 1e that extends from the source-side end thereof toward the drain-side end thereof. In the second impurity-implanting step shown in FIG. 7D, the position of the drain-side end of the first channel region 1e is determined in such a manner that the n-type impurity ions are implanted into the polycrystalline silicon layer 1a using the gate electrode 3c as a mask. Therefore, the channel length of the first channel region 1e can be determined by the position of the first resist mask 9a and the position of the gate electrode 3c. In the manufacturing method, a low-resolution exposure system can be used. This increases the throughput of an exposure operation because the area exposed with the low-resolution exposure system in one operation is large.

Fifth Embodiment

FIGS. 8A to 8F are illustrations which show a method for manufacturing first thin-film transistors 10, used in a light-emitting apparatus according to a fifth embodiment of the present invention, for current control and which also snow the configuration of each first thin-film transistor 10.

Configuration

The first thin-film transistor 10, as well as that of the first embodiment, shown in FIG. 8F has the multi-gate structure (Structure D) described with reference to FIGS. 12A, 12B, and 12C. In order to achieve the multi-gate structure, polycrystalline silicon layers 1a are formed above a transparent plate 15, included in an element substrate 13, serving as a base in a dotted pattern and then processed such that first thin-film transistor sections 10a and second thin-film transistor sections 10b are formed. Each first thin-film transistor section 10a is located on the drain side and each second thin-film transistor section 10b is located on the source side. In this embodiment as well as the first embodiment, the polycrystalline silicon layers 1a are formed in such a manner that amorphous silicon layers are formed above the element substrate 13 and then polycrystallized by laser annealing or lamp annealing. A third thin-film transistor section 10c is formed on the source side of the second thin-film transistor section 10b so as to be located at a position symmetrical to the position of the first thin-film transistor section 10a.

A gate electrode 3c that is common to the firsts second, and third thin-film transistor sections 10a, 10b, and 10c is disposed on a gate-insulating layer 2.

The following regions are arranged in each polycrystalline silicon layer 1a in this order in the direction from the drain side to the source side: a first heavily doped n-type region 1c, a first channel region 1e, a sixth lightly doped n-type region 1s, a second channel region 1i, a seventh lightly doped n-type region 1t, a third channel region 1l, and a fourth heavily doped n-type region 1n. The first heavily doped n-type region 1c, the first channel region 1e, and the sixth lightly doped n-type region is form the first thin-film transistor section 15a. The sixth lightly doped n-type region 1s, the second channel region 1i, and the seventh lightly doped n-type region 1t form the second thin-film transistor section 10b. The seventh lightly doped n-type region 1t, the third channel region 1l, and the fourth heavily doped n-type region 1n form the third thin-film transistor section 10c. The sixth lightly doped n-type region is functions as a node between the first and second thin-film transistors 10a and 10b.

In this embodiment, the first and third channel regions 1e and 1l are formed in such a manner that p-type impurity ions (first impurity ions) and n-type impurity ions (second impurity ions) are implanted into the polycrystalline silicon layer 1a at the same dose as described below. Therefore, the first and third channel regions 1e and 1l function as intrinsic regions.

The first and fourth heavily doped n-type regions 1c and 1n are self-aligned with the gate electrode 3c. The gate electrode 3c extends over the first channel region 1e, the sixth lightly doped n-type region 1s, the second channel region 1i, the seventh lightly doped n-type region 1t, and the third channel region 1l with the gate-insulating layer 2 disposed between the gate electrode 3c and these regions.

In the first thin-film transistor 10 as well as that of the first or second embodiment, the channel length $L_a$ of the first thin-film transistor section 1a is less than 2 μm. In particular, the channel length $L_a$ thereof is 0.5 μm or more and less than 1.5 μm. The channel length $L_b$ of the second thin-film transistor section 10b is 8 μm or more. Therefore, the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b.

The channel length $L_c$ of the third thin-film transistor section 10c, which is located at the position symmetrical to the position of the first thin-film transistor section 10a, is less than 2 μm. In particular, the channel length $L_c$ thereof is 0.5 μm or more and less than 1.5 μm. Therefore, the quotient $W_c/L_c$ obtained by dividing the channel width $W_c$ of the third thin-film transistor section 10c by the channel length $L_c$ of the third thin-film transistor section 10c is four times or more greater than the quotient $W_b/L_b$ obtained by dividing the channel width $W_b$ of the second thin-film transistor section 10b by the channel length $L_b$ of the second thin-film transistor section 10b.

Since the first thin-film transistor 10 has the multi-gate structure described with reference to FIGS. 12A, 12B, and 12C as described above, a kink effect can be prevented and therefore the saturation operation can be improved. Furthermore, since the quotient $W_a/L_a$ obtained by dividing the channel width $W_a$ of the first thin-film transistor section 10a by the channel length $L_a$ of the first thin-film transistor section 10a is four times or more greater than the quotient $W_b/L_b$ obtained by dividing the channel width $W_b$ of the second thin-film transistor section 10b by the channel length $L_b$ of the second thin-film transistor section 10b, the operating point of the first thin-film transistor section 10a is not in the linear operation region of the second thin-film transistor section 10b. The channel length $L_a$ of the first thin-film transistor section 10a is less than 2 μm, that is, the channel length $L_a$ thereof is small; hence, the threshold voltage of the first thin-film transistor section 10a decreases in the depletion direction because of a short channel effect. Therefore, current-voltage characteristics of the first thin-film transistor section 10a ($TFT_d$) shift such that the node voltage $V_m$ increases as shown in FIG. 4. This allows the operating point to be located in a region sufficiently apart from the pinch-off voltage $V_p$ of the second thin-film transistor section 10b ($TFT_s$). In this region, the ratio of a change in the source-drain current $I_{ds}$ to a change in the source-drain voltage $V_{ds}$ is large. Therefore, in the first thin-film transistor 10 as well as a structure including two thin-film transistors connected to each other in cascode, a change in the drain current can be reduced in the saturation region. This leads to a great improvement in the saturation operation of the first thin-film transistor 10. Since the channel length $L_a$ of the first thin-film transistor section 10a is 0.5 μm or more and less than 1.5 μm, the operating point can be set in a region which is not affected by the kink effect of the second thin-film transistor section 10b and which is sufficiently apart from the pinch-off voltage $V_p$. Hence, the saturation operation of the first thin-film transistor 10 can be improved securely and greatly.

Since the third thin-film transistor section 10c is disposed on the source side of the second thin-film transistor sections 10b and is located at the position symmetrical to the position of the first thin-film transistor section 10a, the kink effect can be prevented and therefore the saturation operation can be improved even if the source-drain voltage is inverted.

In this embodiment the seventh lightly doped n-type region 1t is disposed between the first channel region 1e and the second channel region 1i; hence, holes generated at the drain end by impact ionization are prevented from entering the second channel region 1i. That is, since an electric field applied to the seventh lightly doped n-type region 1t is weak, the holes are readily recombined with electrons in the seventh lightly doped n-type region 1t and therefore cannot reach the second channel region 1i. The seventh lightly doped n-type region 1t need not be in ohmic contact with any drain electrode and therefore may have a size of about 0.5 μm in the channel length direction and an impurity concentration of about $5 \times 10^{7 cm-17}$. The gate electrode 1c is not opposed to any heavily doped n-type region but is opposed to the sixth lightly doped n-type region 1s with the gate-insulating layer 2 disposed therebetween. This prevents the formation of a capacitor parasitic in the gate electrode 3c.

Manufacturing Method

Figure 8A:
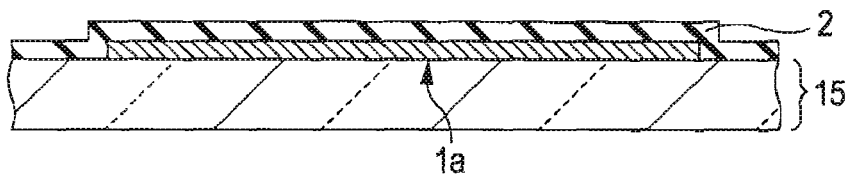
FIGS. 8A to 8F are illustrations which show a method for manufacturing first thin-film transistors, used in a light-emitting apparatus according to a fifth embodiment of the present invention, for current control and which also show the configuration of each first thin-film transistor.

A method for manufacturing the first thin-film transistors 10 will now be described. As shown in FIG. 8A, the polycrystalline silicon layers 1a are formed in a dotted pattern and the gate-insulating layer 2 is formed over the polycrystalline silicon layers 1a in the same manner as that described in the second embodiment.

Figure 8B:
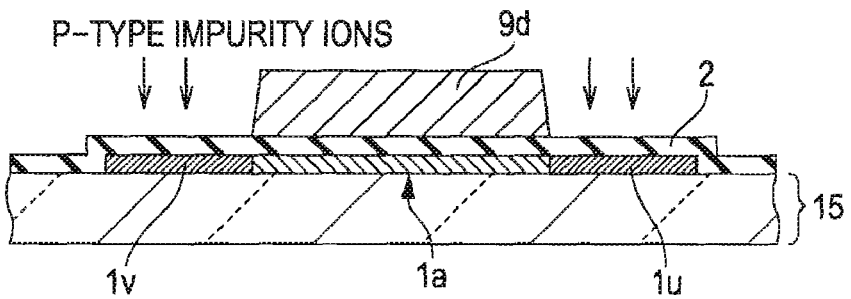
Figure 8C:
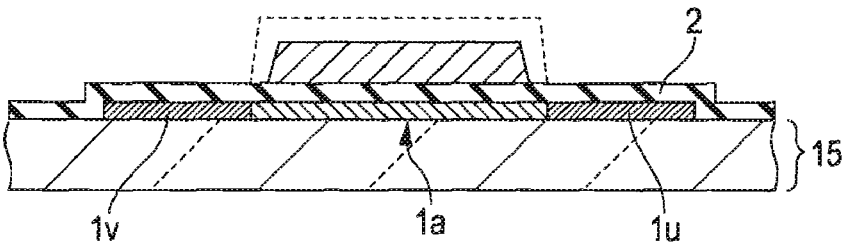

In a first impurity-implanting step shown in FIG. 8B, a resist mask 9d is formed on the gate-insulating layer 2, p-type impurity ions (first impurity ions) such as boron ions are implanted into each polycrystalline silicon layer 1a at a dose of about $0.1 \times 10^{13}/cm^2$ to $10 \times 10^{13}/cm^2$, whereby lightly doped p-type regions 1u and 1v (first conductive regions) are formed. The resist mask 9d is placed at a position overlapping with a zone for forming the sixth lightly doped n-type region is, the second channel region 1i, and the seventh lightly doped n-type region it as shown in FIG. 8F.

In a mask partly removing step shown in FIG. 8, the resist mask 9d is half-ashed, that is, the resist mask 9d is partly removed. The resulting resist mask 9d has a reduced thickness and only covers a zone for forming the second channel region 1i. This allows a zone for forming the sixth lightly doped n-type region is shown in FIG. 8F and a zone for forming the seventh lightly doped n-type region 1t shown in FIG. 8F to be exposed from the resulting resist mask 9d.

Figure 8D:
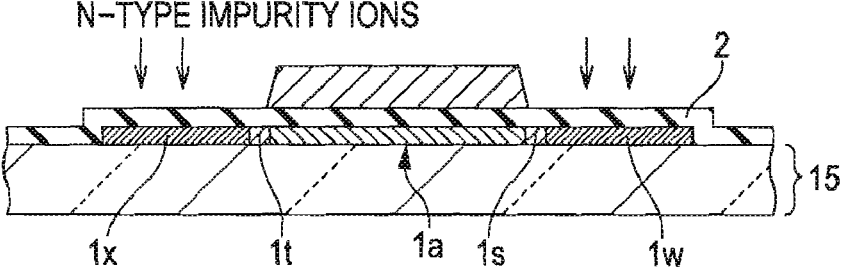

In a second impurity-implanting step shown in FIG. 8D, n-type impurity ions (second impurity ions) such as phosphorus ions are implanted into the polycrystalline silicon layer 1a at a dose of about $0.1 \times 10^{13}/cm^2$ to $10 \times 10^{13}/cm^2$ using the resulting resist mask 9d, which is then removed. This allows the sixth and seventh lightly doped n-type regions 1s and it to be formed around the resulting resist mask 9d and converts the lightly doped p-type regions 1u and 1v into intrinsic regions 1w and 1x in which the dose of the p-type impurity ions is substantially the same as those of the n-type impurity ions.

Figure 8E:
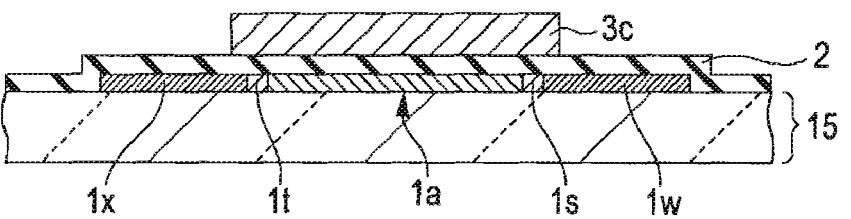

In a gate electrode-forming step shown in FIG. 8E, a metal layer is formed over the gate-insulating layer 2 and then patterned into the gate electrodes 3c by photolithography. Each gate electrode 3c is located at a position overlapping with a zone for forming the first channel region 1e, the sixth lightly doped n-type region 1s, the second channel region 1i, the seventh lightly doped n-type region 1t, and the third channel region 1l as shows in FIG. 8F.

Figure 8F:
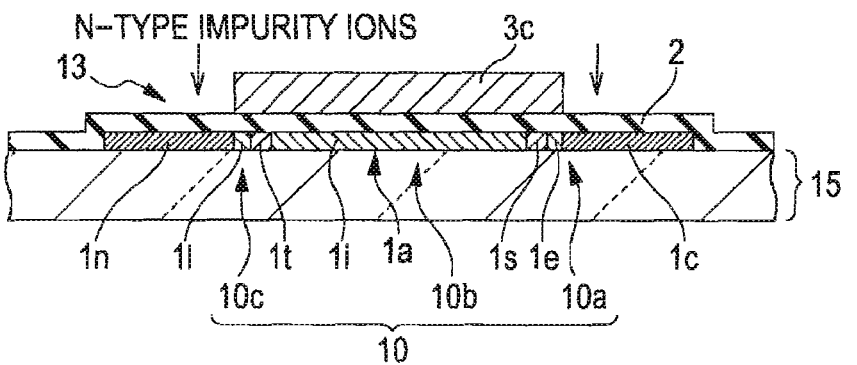

In a third impurity-implanting step shown in FIG. 8F, the n-type impurity ions (the second impurity ions) are implanted into the polycrystalline silicon layer 1a at a dose of about $0.1 \times 10^{15}/cm^2$ to $10 \times 10^{15}/cm^2$ using the gate electrode 3c as a mask. This allows the first, second, and third channel regions 1e, 1i, and 1l in a zone covered with the gate electrode 3c and also allows the first and fourth heavily doped n-type regions 1c and 1n to be formed such that the first and fourth heavily doped n-type regions 1c and in are self-aligned with the gate electrode 3c.

The first thin-film transistors 10, which include the first, second, and third thin-film transistor sections 10a, 10b, and 10c, are fabricated as described above. Steps subsequent to the fabrication of the first thin-film transistors 10 are the same as those described in the second embodiment and therefore are not described.

According to the manufacturing method of this embodiment, in the first impurity-implanting step shovel in FIG. 8B, the lightly doped p-type regions 1u and 1v are formed in such a manner that the p-type impurity ions are implanted into the polycrystalline silicon layer 1a using the resist mask 9d, which covers a zone extending from the source-side end of the first channel region 1e on the source side. In the second impurity-implanting step shown in FIG. 8D, the lightly doped p-type regions 1u and 1v are converted into the intrinsic regions 1w and 1x, whereby the position of the source-side end of the first channel region 1e is determined. In the third impurity-implanting step shown in FIG. 8F, the n-type impurity ions are implanted into the polycrystalline silicon layer 1a using the gate electrode 3c as a mask, whereby the position of the drain-side end of the first channel region 1e is determined. Therefore, the channel length of the first channel region 1e can be determined by the position of the resist mask 9d and the position of the gate electrode 3c. In the manufacturing method, a low-resolution exposure system can be used. This increases the throughput of an exposure operation because the area exposed with the low-resolution exposure system in one operation is large.

Other Embodiments

The first thin-film transistors 10 described in the above embodiments are of an n-type and may be of a p-type. When the first thin-film transistors 10 are of a p-type, the terms "n-type" and "p-type" used in the above embodiments may be exchanged for each other.

Figure 9:
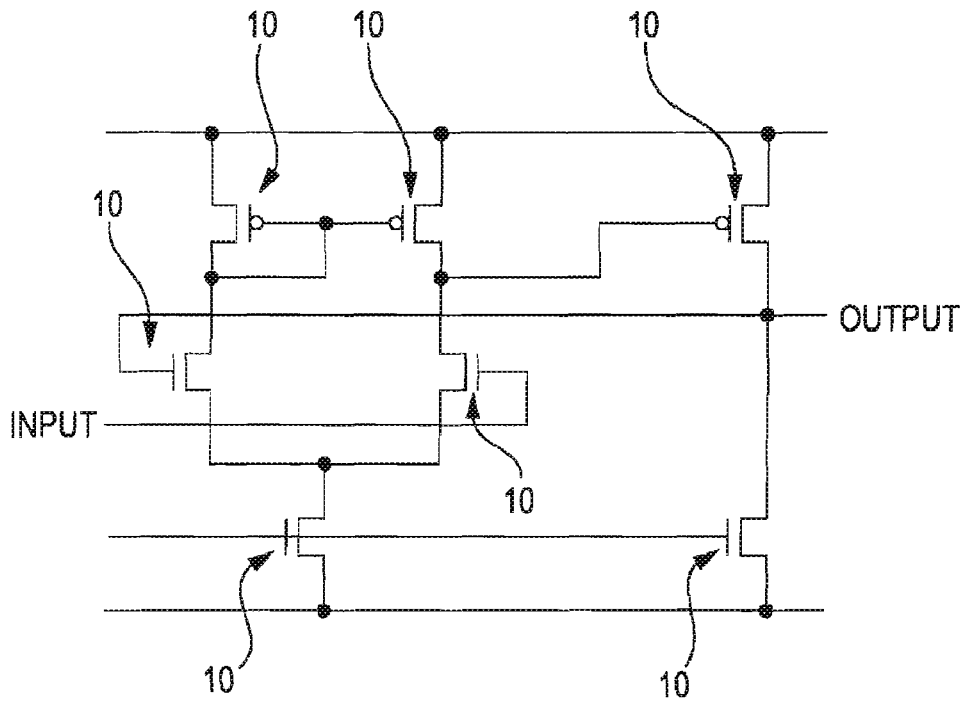
FIG. 9 is a diagram of a driving circuit placed above an element circuit which is an example of a semiconductor device according to the present invention and which is used in a liquid crystal apparatus.
Figure 10:
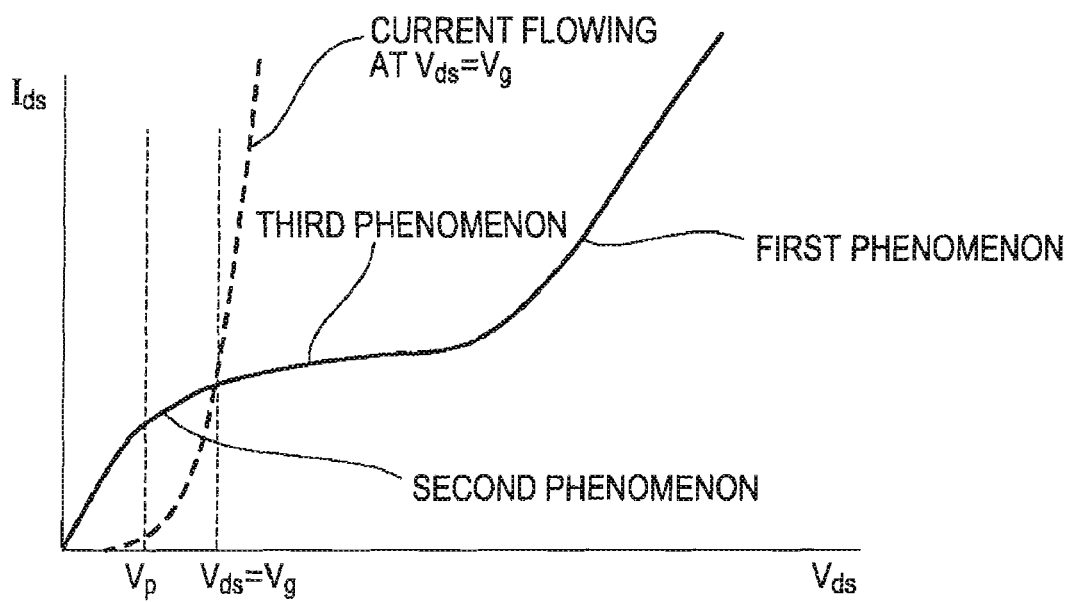
FIG. 10 is an illustration showing problems of a conventional thin-film transistor.
Figure 11A:
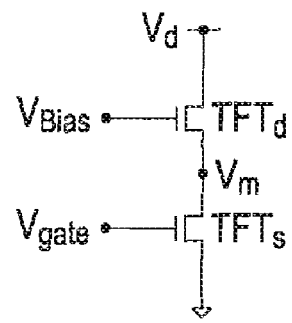
FIGS. 11A to 11C are illustrations showing two thin-film transistors connected to each other in cascode.
Figure 11B:
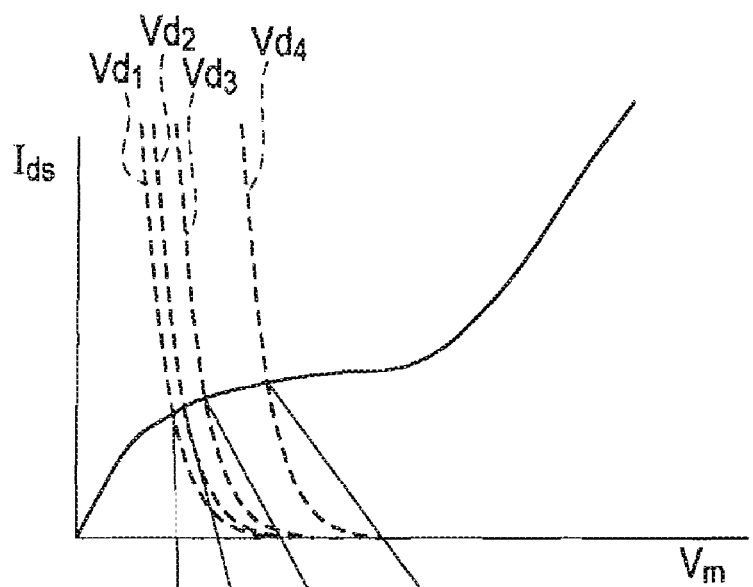
Figure 11C:
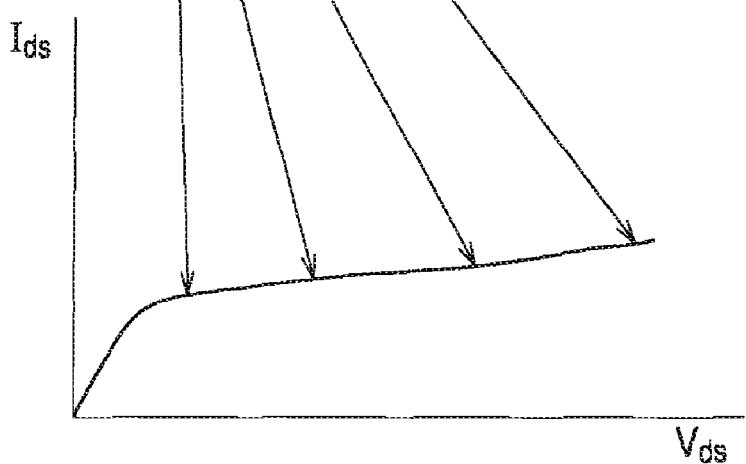

In each above embodiment, the element substrate 13 used in the light-emitting apparatus 100 including the organic EL elements 40 is described as an example of a semiconductor device according to the present invention. An example of a driving circuit placed above an element substrate (a semiconductor device) used in a liquid crystal apparatus is an analogue circuit, including an operational amplifier, shown in FIG. 9. Therefore, output buffers having good linearity and a small offset can be obtained in such a manner that the first thin-film transistors 10 are incorporated in driving circuits, current mirror circuits, or output circuits.

What is claimed is:

1. A semiconductor device comprising:
   a thin-film transistor including transistor, the thin-film transistor including:
   a polycrystalline silicon layer that is disposed above a substrate, serving as an active layer,
   a first thin-film transistor section including a first channel region disposed in a drain-side portion of the polycrystalline silicon layer,
   a second thin-film transistor section including a second channel region adjacent to the first channel region with at least one of impurity-implanted region disposed between the first channel region and the second channel region,
   a third thin-film transistor section is formed on the source side of the second thin-film transistor section so as to be located at a position symmetrical to the position of the first thin-film transistor section,
   a common gate electrode that is shared by the first, second, and third thin-film transistor sections is disposed on a gate-insulating layer,
   wherein the first thin-film transistor section includes no lightly doped region on the source side but a lightly doped region located on the drain side; the second thin-film transistor section includes no lightly doped region on the drain or source side; and the third thin-film transistor section includes no lightly doped region on the drain side but a lightly doped n-type region located on the source side.

2. The semiconductor device according to claim 1, wherein the channel length of the first thin-film transistor section is 0.5 µm or more and less than 1.5 µm.

3. The semiconductor device according to claim 1, wherein the quotient obtained by dividing the channel width of the first thin-film transistor section by the channel length of the first thin-film transistor section is four times or more greater than the quotient obtained by dividing the channel width of the second thin-film transistor section by the channel length of the second thin-film transistor section.

4. The semiconductor device according to claim 1, wherein at least one of the first and second thin-film transistor sections includes a lightly doped drain region that is adjacent to a channel region on the drain side.

5. The semiconductor device according to claim 1, wherein the first and second gate electrodes are joined to each other so as to cover a zone extending from the first channel region to the second channel region with a gate-insulating layer disposed between the first and second gate electrodes and the first and second channel regions.

6. A method for manufacturing the semiconductor device according to claim 1, comprising:
   a first impurity-implanting step in which after the polycrystalline silicon layer is formed above the substrate, impurity ions are implanted into the polycrystalline silicon layer using a mask covering a portion of the first channel region that extends from the source-side end of the first channel region toward the drain-side end thereof such that the position of the source-side end thereof is determined;
   a gate electrode-forming step which is subsequent to the first impurity-implanting step and in which the common gate electrode are formed; and
   a second impurity-implanting step in which the impurity ions are implanted into the polycrystalline silicon layer using the common gate electrode as masks such that the position of the drain-side end of the first channel region is determined.

7. A method for manufacturing the semiconductor device according to claim 1, comprising:
   a first impurity-implanting step in which after the polycrystalline silicon layer is formed above the substrate, first impurity ions are implanted into the polycrystalline silicon layer using a mask covering a portion of the first channel region that extends from the source-side end of the first channel region toward the drain-side end thereof such that a first conductive region is formed;

a mask partly removing step in which the mask is partly removed so as to be downsized;

a second impurity-implanting step in which second impurity ions are implanted into the polycrystalline silicon layer at the same dose as that of the first impurity ions using the mask downsized in the mask partly removing step such that the first conductive region is converted into an intrinsic region;

a gate electrode-forming step which is subsequent to the second impurity-implanting step and in which the common gate electrode are formed; and a third impurity-implanting step in which the second impurity ions are implanted into the polycrystalline silicon layer using the common gate electrode as masks such that the position of the drain-side end of the first channel region is determined.

8. An electro-optical apparatus comprising:
the conductor device according to claim 1,
wherein the semiconductor device is an element substrate having a plurality of pixels.

* * * * *